(12) United States Patent
Gournay et al.

(10) Patent No.: US 8,332,213 B2
(45) Date of Patent: Dec. 11, 2012

(54) MULTI-REFERENCE LPC FILTER QUANTIZATION AND INVERSE QUANTIZATION DEVICE AND METHOD

(75) Inventors: Philippe Gournay, Sherbrooke (CA); Bruno Bessette, Sherbrooke (CA); Redwan Salami, Saint-Laurent (CA)

(73) Assignee: VoiceAge Corporation, Town of Mount Royal, Quebec (CA)

( * ) Notice: Subject to any disclaimer, the term of this patent is extended or adjusted under 35 U.S.C. 154(b) by 781 days.

(21) Appl. No.: 12/501,188

(22) Filed: Jul. 10, 2009

(65) Prior Publication Data

US 2010/0023323 A1    Jan. 28, 2010

Related U.S. Application Data

(60) Provisional application No. 61/129,669, filed on Jul. 10, 2008, provisional application No. 61/202,075, filed on Jan. 27, 2009.

(51) Int. Cl.
*G10L 21/00* (2006.01)
(52) U.S. Cl. .... 704/219; 704/220; 704/500; 375/240.23
(58) Field of Classification Search .................. 704/219, 704/220, 500; 375/240.23
See application file for complete search history.

(56) References Cited

U.S. PATENT DOCUMENTS

| | | | |
|---|---|---|---|
| 5,255,339 A | | 10/1993 | Fette et al. |
| 5,649,051 A | * | 7/1997 | Rothweiler et al. .......... 704/222 |
| 5,778,334 A | * | 7/1998 | Ozawa et al. ................ 704/219 |
| 5,859,932 A | | 1/1999 | Etoh |
| 6,018,707 A | | 1/2000 | Nishiguchi et al. |
| 6,122,608 A | | 9/2000 | McCree |
| 6,134,520 A | * | 10/2000 | Ravishankar ................. 704/222 |
| 6,385,575 B1 | | 5/2002 | Amada et al. |
| 6,477,490 B2 | | 11/2002 | Nakatoh et al. |
| 6,487,535 B1 | * | 11/2002 | Smyth et al. .................. 704/500 |
| 6,611,800 B1 | | 8/2003 | Nishiguchi et al. |
| 6,687,667 B1 | | 2/2004 | Gournay et al. |

(Continued)

FOREIGN PATENT DOCUMENTS

CA    2511516    7/2004

(Continued)

OTHER PUBLICATIONS

3rd Generation Partnership Project; Technical Specification Group Service and System Aspects; Audio codec processing functions; Extended Adaptive Multi-Rate—Wideband (AMR-WB+) codec; Transcoding functions (Release 8) 3GPP TS 26.290 V8.0.0 (Dec. 2008).

(Continued)

*Primary Examiner* — Daniel D Abebe
(74) *Attorney, Agent, or Firm* — K&L Gates LLP

(57) ABSTRACT

A multi-reference quantization device and method for quantizing an input LPC filter, comprises a plurality of differential quantizers using respective, different references, and a selector of a reference amongst the different references of the differential quantizers using a reference selection criterion. The input LPC filter is differentially quantized by the differential quantizer using the selected reference. A device and method for inverse quantizing a multi-reference differentially quantized LPC filter extracted from a bitstream, comprises an extractor from the bitstream of information about a reference amongst a plurality of possible references used for quantizing the multi-reference differentially quantized LPC filter, and a differential inverse quantizer using the reference corresponding to the extracted reference information to inverse quantize the multi-reference differentially quantized LPC filter.

36 Claims, 8 Drawing Sheets

U.S. PATENT DOCUMENTS

| | | | |
|---|---|---|---|
| 6,996,523 | B1 | 2/2006 | Bhaskar et al. |
| 7,243,061 | B2 | 7/2007 | Norimatsu et al. |
| 7,315,815 | B1 | 1/2008 | Gersho et al. |
| 2007/0219789 | A1 | 9/2007 | Capman |
| 2007/0282603 | A1 | 12/2007 | Bessette |
| 2008/0052068 | A1 | 2/2008 | Aguilar et al. |
| 2008/0126085 | A1 | 5/2008 | Morii |

FOREIGN PATENT DOCUMENTS

| | | |
|---|---|---|
| CA | 2603219 | 10/2006 |
| WO | 2004008437 | 1/2004 |
| WO | 2004090864 | 10/2004 |
| WO | 2007040349 | 4/2007 |

OTHER PUBLICATIONS

International Search Report for International Application No. PCT/CA2009/000981, mailed from the Canadian Intellectual Property Office as International Searching Authority on Aug. 24, 2009.

International Search Report for International Application No. PCT/CA2009/000979, mailed from the Canadian Intellectual Property Office as International Searching Authority on Sep. 22, 2009.

International Search Report for International Application No. PCT/CA2009/000980, mailed from the Canadian Intellectual Property Office as International Searching Authority on Oct. 7, 2009.

Juang, Biing-Hwang, et al.; "Multiple Stage Vector Quantization for Speech Coding" IEEE, 1982: 597-600.

Salami, Redwan, et al.; "Extended AMR-WB for High-Quality Audio on Mobile Devices" IEEE Communications Magazine, May 2006: 90-97.

Makinen, Jari, et al.; "AMR-WB+: A New Audio Coding Standard for 3rd Generation Mobile Audio Services" IEEE, ICASSP 2005:1109-1112.

Skoglund, Jan, et al.; "Predictive VQ for Noisy Channel Spectrum Coding: AR or MA?" IEEE, 1997: 1351-1354.

Zarrinkoub, Houman, et al.; "Switched Prediction and Quantization of LSP Frequencies" IEEE, 1995: 757-760.

Ferhaoui, M., et al.; "LSP Quantization in Wideband Speech Coders" IEEE, 1999: 25-27.

Laurent, Pierre A.; "Expression of Spectral Distortion using Line Spectrum Frequencies" IEEE Transactions on Speech and Audio Processing, vol. 5, No. 5, Sep. 1997: 481-484.

Paliwal, Kuldip K., et al.; "Efficient Vector Quantization of LPC Parameters at 24 Bits/Frame" IEEE Transactions on Speech and Audio Processing, vol. 1, No. 1, Jan. 1993: 3-14.

Juang, Biing-Hwang, et al.; "Distortion Performance of Vector Quantization for LPC Voice Coding" IEEE Transactions on Acoustics, Speech, and Signal Processing, vol. ASSP-30, No. 2, Apr. 1982: 294-304.

Laroia, Rajiv, et al.; "Robust and Efficient Quantization of Speech LSP Parameters Using Structured Vector Quantizers" IEEE, 1991: 641-644.

Xie, Minjie, et al.; "Embedded Algebraic Vector Quantizers (EAVQ) With Application to Wideband Speech Coding" IEEE, 1996: 240-243.

Rault, Patrick, et al.; "Indexing Algorithms for Zn, An, Dn, and Dn++ Lattice Vector Quantizers" IEEE Transactions on Multimedia, vol. 3, No. 4, Dec. 2001: 395-404.

Conway, John H., et al.; "A Fast Encoding Method for Lattice Codes and Quantizers" IEEE Transactions on Information Theory, vol. IT-29, No. 6, Nov. 1983: 820-824.

MPEG2007/N9519, Audio Subgroup, "Call for Proposals on Unified Speech and Audio Coding," International Organisation for Standardisation ISO/IEC JTC1/SC29/WG11 Coding of Moving Pictures and Audio, Oct. 2007, Shenzhen, China.

MPEG2008/M15867, Fraunhofer IIS, VoiceAge Corp., "Detailed Technical Description of Reference Model 0 of the CfP on Unified Speech and Audio Coding (USAC)," International Organisation for Standardisation ISO/IEC JTC1/SC29/WG11 Coding of Moving Pictures and Audio, Oct. 2008, Busan, South Korea.

Ragot, Stephane, et al.; "Stochastic-Algebraic Wideband LSF Quantization" IEEE, 2000: 1169-1172.

"Digital cellular telecommunications system (Phase 2+); Universal Mobile Telecommunications System (UMTS); Audio codec processing functions; Extended Adaptive Multi-Rate—Wideband (AMR-WB+)codec; Transcoding functions (3GPP TS 26.290 version 7.0.0 Release 7); ETSI TS 126 290", IEEE, LIS, Sophia Antipolis Cedex, France, vol. 3-SA4, No. V7.0.0, Mar. 1, 2007.

Extended European Search Report for European Patent Application No. 09793768.4, dated Jul. 12, 2012, 8 pages.

Extended European Search Report for European Patent Application No. 09793770.0, dated Jul. 12, 2012, 8 pages.

\* cited by examiner

Operation 1: Quantize LPC4 using absolute quantizer

Operation 2: Quantize LPC2 using differential quantizer (or absolute quantizer as a safety-net solution)

Operation 3: Quantize LPC1 and LPC3 using differential quantizer (or absolute quantizer as a safety-net

MULTI-REFERENCE LPC FILTER QUANTIZATION AND INVERSE QUANTIZATION DEVICE AND METHOD

CROSS REFERENCE TO RELATED APPLICATIONS

This application claims priority to and the benefit of U.S. Provisional Patent Application 61/129,669, filed on Jul. 10, 2008 and to U.S. Provisional Patent Application 61/202,705, filed on Jan. 27, 2009.

FIELD

The present invention relates to coding and decoding of a sound signal, for example an audio signal. More specifically, but not exclusively, the present invention relates to multi-reference LPC filter quantization and inverse quantization device and method.

BACKGROUND

The demand for efficient digital speech and audio coding techniques with a good trade-off between subjective quality and bit rate is increasing in various application areas such as teleconferencing, multimedia, and wireless communication.

A speech coder converts a speech signal into a digital bit stream which is transmitted over a communication channel or stored in a storage medium. The speech signal to be coded is digitized, that is sampled and quantized using for example 16-bits per sample. A challenge of the speech coder is to represent the digital samples with a smaller number of bits while maintaining a good subjective speech quality. A speech decoder or synthesizer converts the transmitted or stored bit stream back to a speech signal.

Code-Excited Linear Prediction (CELP) coding is one of the best techniques for achieving a good compromise between subjective quality and bit rate. The CELP coding technique is a basis for several speech coding standards both in wireless and wireline applications. In CELP coding, the speech signal is sampled and processed in successive blocks of L samples usually called frames, where L is a predetermined number of samples corresponding typically to 10-30 ms of speech. A linear prediction (LP) filter is computed and transmitted every frame; the LP filter is also known as LPC (Linear Prediction Coefficients) filter. The computation of the LPC filter typically uses a lookahead, for example a 5-15 ms speech segment from the subsequent frame. The L-sample frame is divided into smaller blocks called subframes. In each subframe, an excitation signal is usually obtained from two components, a past excitation and an innovative, fixed-codebook excitation. The past excitation is often referred to as the adaptive-codebook or pitch-codebook excitation. The parameters characterizing the excitation signal are coded and transmitted to the decoder, where the excitation signal is reconstructed and used as the input of the LPC filter.

In applications such as multimedia streaming and broadcast, it may be required to encode speech, music, and mixed content at low bit rate. For that purpose, encoding models have been developed which combine a CELP coding optimized for speech signals with transform coding optimized for audio signals. An example of such models is the AMR-WB+ [1], which switches between CELP and TCX (Transform Coded eXcitation). In order to improve the quality of music and mixed content, a long delay is used to allow for finer frequency resolution in the transform domain. In AMR-WB+, a so-called super-frame is used which consists of four CELP frames (typically 80 ms).

A drawback is that, although the CELP coding parameters are transmitted once every 4 frames in AMR-WB+, quantization of the LPC filter is performed separately in each frame. Also, the LPC filter is quantized with a fixed number of bits per frame in the case of CELP frames.

DETAILED DESCRIPTION

Figure 1:
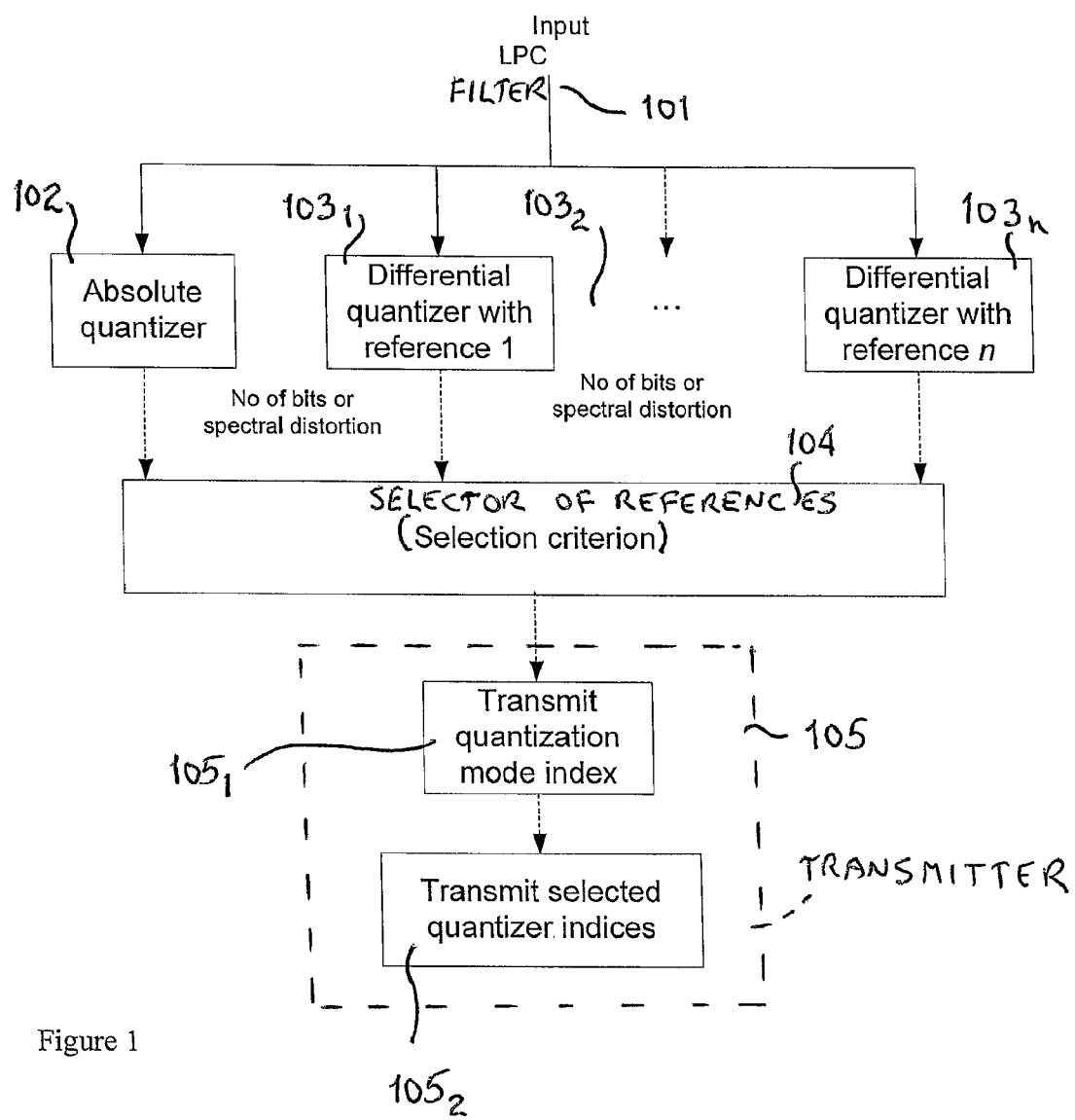
FIG. 1 is a block diagram illustrating an absolute and multi-reference differential LPC filter quantizer and quantizing method.

According to a non-restrictive illustrative embodiments of the present invention, there are provided:

A multi-reference quantization device for quantizing an input LPC filter, comprising: a plurality of differential quantizers using respective, different references; and means for selecting a reference amongst the different references of the differential quantizers using a reference selection criterion. The input LPC filter is differentially quantized by the differential quantizer using the selected reference.

A multi-reference quantization device for quantizing an input LPC filter, comprising: a plurality of differential quantizers using respective, different references; and a selector of a reference amongst the different references of the differential quantizers using a reference selection criterion. The input LPC filter is differentially quantized by the differential quantizer using the selected reference.

A multi-reference quantization device for quantizing an input LPC filter, comprising: a plurality of differential quantizers using respective, different references; and a selector of a reference amongst the different references of the differential quantizers using a reference selection criterion. The input LPC filter is differentially quantized by the differential quantizer using the selected reference; and at least one of the references is selected from the group consisting of: a previously quantized LPC filter; a future quantized LPC filter; a mean value of the previously quantized and future quantized LPC filters; a LPC filter quantized using an absolute quantizer; a result of an extrapolation operation applied to a past quantized LPC filter; a result of an extrapolation operation applied to a future quantized LPC filter; a result of an interpolation operation applied to a past quantized LPC filter; a result of an interpolation operation applied to a future quantized LPC filter; a result of an auto-regressive prediction applied to a quantized LPC filter; a result of a moving average prediction applied to a quantized LPC filter; and a quantized filter value known to both an encoder and a decoder.

A multi-reference quantization device for quantizing an input LPC filter, comprising: a plurality of differential quantizers using respective, different references; and a selector of a reference amongst the different references of the differential quantizers using a reference selection criterion. The input LPC filter is differentially quantized by the differential quantizer using the selected reference, and the reference selection criterion is selected from the group consisting of: a first criterion that minimizes a bit rate to achieve a target level of distortion; and a second criterion that minimizes the level of distortion produced at a given bit rate.

A quantization device for quantizing an input LPC filter, comprising: a plurality of differential quantizers using respective, different references; at least one absolute quantizer; and a selector of one of absolute quantization mode and differential quantization modes for quantizing the input LPC filter using a quantization mode selection criterion, and of a reference amongst the different references of the differential quantizers using a reference selection criterion.

A quantization device for quantizing an input LPC filter, comprising: a plurality of differential quantizers using respective, different references; at least one absolute quantizer; and a selector of one of absolute quantization mode and differential quantization modes for quantizing the input LPC filter using a quantization mode selection criterion, and of a reference amongst the different references of the differential quantizers using a reference selection criterion. The quantization mode selection criterion is selected from the group consisting of: a first criterion that minimizes a bit rate to achieve a target level of distortion; and a second criterion that minimizes the level of distortion produced at a given bit rate.

A multi-reference quantization method for quantizing an input LPC filter, comprising: providing a plurality of differential quantizers using respective, different references; selecting a reference amongst the different references using a reference selection criterion; and quantizing the input LPC filter with the differential quantizer using the selected reference.

A multi-reference quantization method for quantizing an input LPC filter, comprising: providing a plurality of differential quantizers using respective, different references; selecting a reference amongst the different references using a reference selection criterion; and quantizing the input LPC filter with the differential quantizer using the selected reference. At least one of the references is selected from the group consisting of: a previously quantized LPC filter; a future quantized LPC filter; a mean value of the previously quantized and future quantized LPC filters; a LPC filter quantized using an absolute quantizer; a result of an extrapolation operation applied to a past quantized LPC filter; a result of an extrapolation operation applied to a future quantized LPC filter; a result of an interpolation operation applied to a past quantized LPC filter; a result of an interpolation operation applied to a future quantized LPC filter; a result of an auto-regressive prediction applied to a quantized LPC filter; a result of a moving average prediction applied to a quantized LPC filter; and a quantized filter value known to both an encoder and a decoder.

A multi-reference quantization method for quantizing an input LPC filter, comprising: providing a plurality of differential quantizers using respective, different references; selecting a reference amongst the different references using a reference selection criterion; and quantizing the input LPC filter with the differential quantizer using the selected reference. The reference selection criterion is selected from the group consisting of: a first criterion that minimizes a bit rate to achieve a target level of distortion; and a second criterion that minimizes the level of distortion produced at a given bit rate.

A quantization method for quantizing an input LPC filter, comprising: providing a plurality of differential quantizers using respective, different references; providing at least one absolute quantizer; and selecting at least one of (a) a quantization mode amongst absolute quantization mode and differential quantization modes for quantizing the input LPC filter using a quantization mode selection criterion, and (b) a reference amongst the different references using a reference selection criterion.

A quantization method for quantizing an input LPC filter, comprising: providing a plurality of differential quantizers using respective, different references; providing at least one absolute quantizer; and selecting at least one of (a) a quantization mode amongst absolute quantization mode and differential quantization modes for quantizing the input LPC filter using a quantization mode selection criterion, and (b) a reference amongst the different references using a reference selection criterion. The quantization mode selection criterion is selected from the group consisting of: a first criterion that minimizes a bit rate to achieve a target level of distortion; and a second criterion that minimizes the level of distortion produced at a given bit rate.

A device for inverse quantizing a multi-reference differentially quantized LPC filter extracted from a bitstream, comprising: means for extracting from the bitstream information about a reference amongst a plurality of possible references used for quantizing the multi-reference differentially quantized LPC filter; and means for inverse quantizing the multi-reference differentially quantized LPC filter using the reference corresponding to the extracted reference information.

A device for inverse quantizing a multi-reference differentially quantized LPC filter extracted from a bitstream, comprising: an extractor from the bitstream of information about a reference amongst a plurality of possible references used for quantizing the multi-reference differentially quantized LPC filter; and a differential inverse quantizer using the reference corresponding to the extracted reference information to inverse quantize the multi-reference differentially quantized LPC filter.

A device for inverse quantizing a multi-reference differentially quantized LPC filter extracted from a bitstream, comprising: an extractor from the bitstream of information about a reference amongst a plurality of possible references used for quantizing the multi-reference differentially quantized LPC filter; and a differential inverse quantizer using the reference corresponding to the extracted reference information to inverse quantize the multi-reference differentially quantized LPC filter. The reference is selected from the group consisting of: a previously quantized LPC filter; a future quantized LPC filter; a mean value of the previously quantized and future quantized LPC filters; a LPC filter quantized using an absolute quantizer; a result of an extrapolation operation applied to a past quantized LPC filter; a result of an extrapolation operation applied to a future quantized LPC filter; a result of an interpolation operation applied to a past quantized LPC filter; a result of an interpolation operation applied to a future quantized LPC filter; a result of an auto-regressive prediction applied to a quantized LPC filter; a result of a moving average prediction applied to a quantized LPC filter; and a quantized filter value known to both an encoder and a decoder.

A device for inverse quantizing a quantized LPC filter extracted from a bitstream, comprising: an extractor from the bitstream of information about a quantization mode amongst absolute quantization mode and differential quantization mode, and of information about a reference amongst a plurality of possible references used in the differential quantization mode; and an absolute inverse quantizer for inverse quantizing the quantized LPC filter when the information about the quantization mode indicates that the LPC filter has been quantized using the absolute quantization mode; and a differential inverse quantizer for inverse quantizing the quantized LPC filter using the reference corresponding to the extracted reference information when the information about the quantization mode indicates that the LPC filter has been quantized using the differential quantization mode.

A method for inverse quantizing a multi-reference differentially quantized LPC filter extracted from a bitstream, comprising: extracting from the bitstream information about a reference amongst a plurality of possible references used for quantizing the multi-reference differentially quantized LPC filter; and inverse quantizing the multi-reference differentially quantized LPC filter using the reference corresponding to the extracted reference information.

A method for inverse quantizing a multi-reference differentially quantized LPC filter extracted from a bitstream, comprising: extracting from the bitstream information about a reference amongst a plurality of possible references used for quantizing the multi-reference differentially quantized LPC filter; and inverse quantizing the multi-reference differentially quantized LPC filter using the reference corresponding to the extracted reference information. The reference is selected from the group consisting of: a previously quantized LPC filter; a future quantized LPC filter; a mean value of the previously quantized and future quantized LPC filters; a LPC filter quantized using an absolute quantizer; a result of an extrapolation operation applied to a past quantized LPC filter; a result of an extrapolation operation applied to a future quantized LPC filter; a result of an interpolation operation applied to a past quantized LPC filter; a result of an interpolation operation applied to a future quantized LPC filter; a result of an auto-regressive prediction applied to a quantized LPC filter; a result of a moving average prediction applied to a quantized LPC filter; and a quantized filter value known to both an encoder and a decoder.

A method for inverse quantizing a quantized LPC filter extracted from a bitstream, comprising: extracting from the bitstream at least one of (a) information about a quantization mode amongst absolute quantization mode and differential quantization mode, and (b) information about a reference amongst a plurality of possible references used in the differential quantization mode; and absolute inverse quantizing the quantized LPC filter when the information about the quantization mode indicates that the LPC filter has been quantized using the absolute quantization mode; and differential inverse quantizing the quantized LPC filter using the reference corresponding to the extracted reference information when the information about the quantization mode indicates that the LPC filter has been quantized using the differential quantization mode.

The foregoing and other features of the present invention will become more apparent upon reading of the following non-restrictive description of embodiments thereof, given by way of example only with reference to the accompanying drawings.

Differential Quantization with a Choice of Possible References

Differential quantization with a choice between several possible references is used. More specifically, a LPC filter is differentially quantized relative to several possible references.

Consecutive LPC filters are known to exhibit a certain degree of correlation. To take advantage of this correlation, LPC quantizers generally make use of prediction. Instead of quantizing the vector of Linear Prediction Coefficients (LPC vector) representing the LPC filter directly, a differential (or predictive) quantizer first computes a predicted value of this LPC vector and, then, quantizes the difference (often called prediction residual) between the original LPC vector and the predicted LPC vector.

Prediction is normally based on previous values of the LPC filter. Two types of predictors are commonly used: moving average (MA) and auto-regressive (AR) predictors. Although AR predictors are often more efficient in reducing the L2-norm (mean square) of the data to be quantized than MA predictors, the latter are sometimes useful because they are less prone to error propagation in case of transmission errors [2].

Since the L2-norm of the prediction residual is on average lower than the L2-norm of the original LPC vector (the ratio between the two depending on the degree of predictability of the LPC filter), a differential (or predictive) quantizer can achieve the same degree of performance as an absolute quantizer but at a lower bit rate.

On average, prediction is indeed efficient at reducing the L2-norm of the data to be quantized. This behavior is not constant however; prediction is much more efficient during stable segments of signal than during transitional segments. Prediction can even lead to increased L2-norm values when the LPC filters change fast. Some performance improvement can be achieved by considering two different predictors, one for highly predictive segments the other for less predictive segments [3, 4]. As mentioned in the foregoing description, this technique uses only past values of the LPC filter.

To overcome this problem, it is proposed to differentially quantize a LPC filter relative to a reference, for example a reference filter, chosen among a number of possible references. The possible reference filters are already quantized past or future LPC filters (hence available at the decoder as at the encoder), or the results of various extrapolation or interpolation operations applied to already quantized past or future LPC filters. The reference filter that provides the lower distortion at a given rate, or the lower bit rate for a given target distortion level, is selected.

FIG. 1 is a block diagram illustrating a multi-reference LPC filter quantization device and method. A given LPC filter 101 represented by a vector of Linear Prediction Coefficients is inputted to the multi-reference LPC filter quantization device and method. The input LPC filter 101 is differentially quantized with respect to a reference chosen among a number of possible references 1, 2, . . . , n. Possible references comprise:

past or future quantized LPC filters;
the result of extrapolation or interpolation operations applied to past or future quantized LPC filters; or
any quantized value available both at the encoder and the decoder.

As a non-limitative example, the input LPC filter 101 can be differentially quantized with respect to the previous quantized LPC filter, the following quantized LPC filter, or a mean value of those two previous and following quantized LPC filters. A reference can also be a LPC filter quantized using an absolute quantizer, or the result of any kind of interpolation, extrapolation or prediction (AR or MA) applied to already quantized LPC filters.

Operations 102 and $103_1, 103_2, \ldots, 103_n$: Still referring to FIG. 1, the input LPC filter 101 is supplied to an absolute quantizer (Operation 102) and to differential quantizers (Operations $103_1, 103_2, \ldots, 103_n$). The absolute quantizer (Operation 102) quantizes the absolute value (not a difference) of the input LPC filter 101. The differential quantizers (Operations $103_1, 103_2, \ldots, 103_n$) are designed to differentially quantize the input LPC filter 101 with respect to respective references 1, 2, . . . , n.

Operation 104: The multi-reference LPC filter quantization device and method of FIG. 1 comprises a selector for selecting a reference amongst the references 1, 2, . . . , n that provides the lowest distortion level at a given bit rate, or the lowest bit rate for a given target distortion level. More specifically, the selector (Operation 104) uses a selection criterion that minimizes the bit rate to achieve a certain target level of distortion, or that minimizes the level of distortion produced at a given bit rate.

In Operation 104, the selection of a reference amongst references 1, 2, . . . , n to be actually used in the differential quantization process can be performed in closed-loop or in open-loop.

In closed-loop, all possible references are tried and the reference that optimizes a certain criterion of distortion or bit rate is chosen. For example, the closed-loop selection can be based on minimizing a weighted mean-squared error between the input LPC vector and the quantized LCP vector corresponding to each reference. Also, the spectral distortion between the input LPC vector and the quantized LPC vector can be used. Alternatively, the quantization using the possible references can be performed while maintaining a distortion under a certain threshold, and the reference that both meets with this criterion and uses the smaller number of bits is chosen. As will be explained in the following description, a variable bit rate algebraic vector quantizer can be used to quantize the scaled residual vector (difference between the input LPC vector and the reference) which uses a certain bit budget based on the energy of the scaled residual vector. In this case, the reference which yields the smaller number of bits is chosen.

In open-loop, the selector of Operation 104 predetermines the reference based on the value of the Linear Prediction Coefficients of the input LPC filter to be quantized and of the Linear Prediction Coefficients of the available reference LPC filters. For example, the L2-norm of the residual vector is computed for all references and the reference that yields the smaller value is chosen.

Operation 105: Following the selection of one of the references 1, 2, . . . , n by the Operation 104, a transmitter (Operation 105) communicates or signals to the decoder (not shown) the quantized LPC filter (not shown) and an index indicative of the quantization mode (sub-operation $105_1$), for example absolute or differential quantization. Also, when differential quantization is used, the transmitter (Operation 105) communicates or signals to the decoder indices representative of the selected reference and associated differential quantizer of Operations $103_1, 103_2, \ldots, 103_n$ (sub-operation $105_2$). Some specific bits are transmitted to the decoder for such signaling.

Using a number of different possible references makes differential quantization more efficient in terms of reduction of the L2-norm of prediction residual compared to restricting to past values only as in conventional prediction. Also, for a given target level of distortion, this technique is more efficient in terms of average bit rate.

Switched Absolute or Differential Quantization

According to a second aspect, switched absolute/differential (or predictive) quantization is used. FIG. 1 illustrates an example of an absolute/differential scheme which selects between one absolute quantizer (Operation 102) and n differential quantizers (Operations $103_1, 103_2, \ldots, 103_n$) using respective, different references 1, 2, . . . , n. Again, the selection of a quantizer can be made by the selector of Operation 104 amongst the absolute and differential quantizers (Operations 102 and $103_1, 103_2, \ldots, 103_n$), wherein the selected quantizer will, according to the selection criterion, minimize the level of distortion produced at a given bit rate or minimize the bit rate to achieve a target level of distortion.

Some LPC filters can be coded using the absolute quantizer (Operation 102). The other LPC filters are coded differentially with respect to one or several reference LPC filters in the differential quantizers (Operations $103_1, 103_2, \ldots, 103_n$).

The absolute quantizer (Operation 102) can be used as a safety-net solution for the otherwise differentially quantized LPC filters, for example in the case of large LPC deviations or when the absolute quantizer (Operation 102) is more efficient than the differential quantizers (Operations $103_1, 103_2, \ldots, 103_n$) in terms of bit rate. The reference LPC filter(s) can be all within the same super-frame to avoid introducing dependencies between super-frames which usually pose problems in case of transmission errors (packet losses or frame erasures).

As explained in the foregoing description, the use of prediction in LPC quantization leads to a reduced L2-norm of the data to be quantized and consequently to a reduction in average bit rate for achieving a certain level of performance. Prediction is not always equally efficient however. In switched LPC [3, 4], a pre-classification of the LPC filter is performed and different predictors are used depending on the predictability of the LPC filter to be quantized. However this technique has been developed in the context of a fixed bit rate, the two differential quantizers requiring a same number of bits to code an LPC filter.

Also, there may be provided one or several absolute quantizers (Operation 102). Moreover, there may be provided one or several differential (predictive) quantizers (Operations $103_1, 103_2, \ldots, 103_n$). Several differential quantizers (Operations $103_1, 103_2, \ldots, 103_n$) involves several possible references such as $1, 2, \ldots, n$ and/or several differential quantizer sizes and/or structures.

As described in the foregoing description, when several differential quantizers (Operations $103_1, 103_2, \ldots, 103_n$) are used, selection of the actual differential quantizer to be used can be performed in an open-loop or in a closed-loop selecting process.

When differential quantization fails to achieve a target level of distortion, or when absolute quantization requires a smaller number of bits than differential quantization to achieve that level of distortion, absolute quantization is used as a safety-net solution. One or several bits, depending on the number of possible absolute and differential quantizers is (are) transmitted through the transmitter (Operation 105) to indicate to the decoder (not shown) the actual quantizer being used.

Absolute/differential quantization combines the advantages of predictive quantization (reduction in bit rate associated with the reduction of the L2-norm of the data to be quantized) with the generality of absolute quantization (which is used as a safety-net in case differential (or predictive) quantization does not achieve a target, for example unnoticeable, level of distortion).

When several differential quantizers (Operations $103_1$, $103_2, \ldots 103_n$) are included, these differential quantizers can make use of either a same predictor or different predictors. In particular, but not exclusively, these several differential quantizers can use the same prediction coefficients or different prediction coefficients.

The decoder comprises means for receiving and extracting from the bit stream, for example a demultiplexer, (a) the quantized LPC filter and (b) the index (indices) or information:
about the quantization mode to determine if the LPC filter has been quantized using absolute quantization or differential quantization; and
about the reference amongst the plurality of possible references that has been used for quantizing the LPC filter.

If the information about the quantization mode indicates that the LPC filter has been quantized using absolute quantization, an absolute inverse quantizer (not shown) is provided for inverse quantizing the quantized LPC filter. If the information about the quantization mode indicates that the LPC filter has been quantized using differential quantization, a differential inverse quantizer (not shown) then differentially inverse quantizes the multi-reference differentially quantized LPC filter using the reference corresponding to the extracted reference information.

Out-of-the-Loop Quantization Scheme

The AMR-WB+ codec is a hybrid codec that switches between a time-domain coding model based on the ACELP coding scheme, and a transform-domain coding model called TCX. The AMR-WB+ proceeds as follows [1]:

The input signal is segmented into super-frames of four (4) frames;

Each super-frame is encoded using a combination of four (4) possible coding modes, each coding mode covering a different duration:
ACELP (covering a duration of one (1) frame);
TCX256 (covering a duration of one (1) frame);
TCX512 (covering a duration of two (2) frames); and
TCX1024 (covering a duration of four (4) frames).

There are therefore 26 possible mode combinations to code each super-frame.

For a given super-frame, the combination of modes which minimizes a total weighted error is determined by a "closed-loop" mode selection procedure. More specifically, instead of testing the 26 combinations, the selection of the mode is performed through eleven (11) different trials (tree search, see Table 1). In AMR-WB+ codec, the closed-loop selection is based on minimizing the mean-squared error between the input and codec signal in a weighted domain (or maximizing the signal to quantization noise ratio).

TABLE 1

The 11 trials for closed-loop mode selection in AMR-WB+

| Trial | Frame 1 | Frame 2 | Frame 3 | Frame 4 |
|---|---|---|---|---|
| 1 | ACELP | | | |
| 2 | TCX256 | | | |
| 3 | | ACELP | | |
| 4 | | TCX256 | | |
| 5 | TCX512 | | | |
| 6 | | | ACELP | |
| 7 | | | TCX256 | |
| 8 | | | | ACELP |
| 9 | | | | TCX256 |
| 10 | | | TCX512 | |
| 11 | | TCX1024 | | |

The LPC filters are one of the various parameters transmitted by the AMR-WB+ codec. Following are some key elements regarding the quantization and transmission of those LPC filters.

Although the different coding modes do not cover the same number of frames, the number of LPC filters transmitted to the decoder is the same for all coding modes and equal to 1. Only the LPC filter corresponding to the end of the covered segment is transmitted. More specifically, in the case of TCX1024, one (1) LPC filter is calculated and transmitted for a duration of four (4) frames. In the case of TCX512, one (1) LPC filter is calculated and transmitted for a duration of two (2) frames. In the case of TCX256 or ACELP, one (1) LPC filter is calculated and transmitted for the duration of one (1) frame.

The AMR-WB+ codec uses a (first order moving-average) predictive LPC quantizer. The operation of the latter quantizer depends on the previously transmitted LPC filter, and consequently on the previously selected coding mode. Therefore, because the exact combination of modes is not known until the entire super-frame is coded, some LPC filters are encoded several times before the final combination of modes is determined.

For example, the LPC filter located at the end of frame 3 is transmitted to the decoder only when the third frame is encoded as ACELP or TCX256. It is not transmitted when frames 3 and 4 are jointly encoded using TCX512. With regards to the LPC filter located at the end of frame 2, it is transmitted in all combinations of modes except in TCX1024. Therefore, the prediction performed when quantizing the last LPC filter of the super-frame depends on the combination of modes for the whole super-frame.

The principle of the disclosed technique is that the order in which the LPC filters are quantized is chosen so that, once the closed-loop decision is finalized, the quantization information corresponding to the unnecessary LPC filters can be skipped from the transmission with no effect on the way the other filters will be transmitted and decoded at the decoder. For each LPC filter to be quantized using the differential quantization strategy described above, this imposes some constraints on the possible reference LPC filters.

Figure 2:
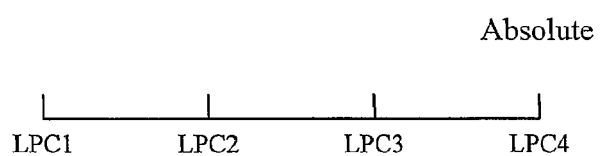
FIG. 2 is a schematic diagram illustrating an open-loop quantization scheme.
Figure 2:
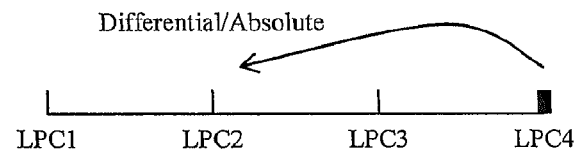
Figure 2:
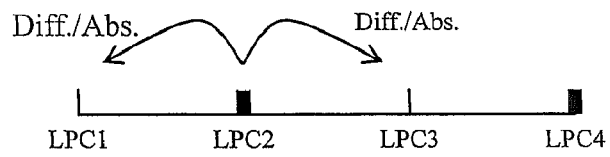

The following example is given with reference to FIG. 2.

Operation 1 of FIG. 2: To avoid any inter super-frame dependencies, at least one LPC filter is quantized using an absolute LPC quantizer. Since filter LPC4 of frame 4 of the super-frame is always transmitted whatever the coding mode combination determined by the closed-loop selection procedure, it is convenient to quantize that filter LPC4 using an absolute quantizer.

Operation 2 of FIG. 2: The next LPC filter to be quantized is filter LPC2 of frame 2 of the super-frame which is transmitted for all combinations of modes except for TCX1024. A differential quantizer can be used, for example to code the difference between filter LPC2 and the absolute quantized version of filter LPC4. The same absolute quantizer as used for coding filter LPC4 can also be used as a safety-net solution, for example in the case of large LPC deviations or when the absolute LPC quantizer is more efficient than the differential quantizer in terms of bit rate and/or level of distortion.

Operation 3 of FIG. 2: The remaining two LPC filters (filter LPC1 of frame 1 of the super-frame and filter LPC3 of frame 3 of the super-frame) are also quantized using the same differential/absolute quantization strategy. Both LPC filters can be quantized relative to the quantized version of filter LPC2. Some alternative strategies are given herein below.

Figure 5:
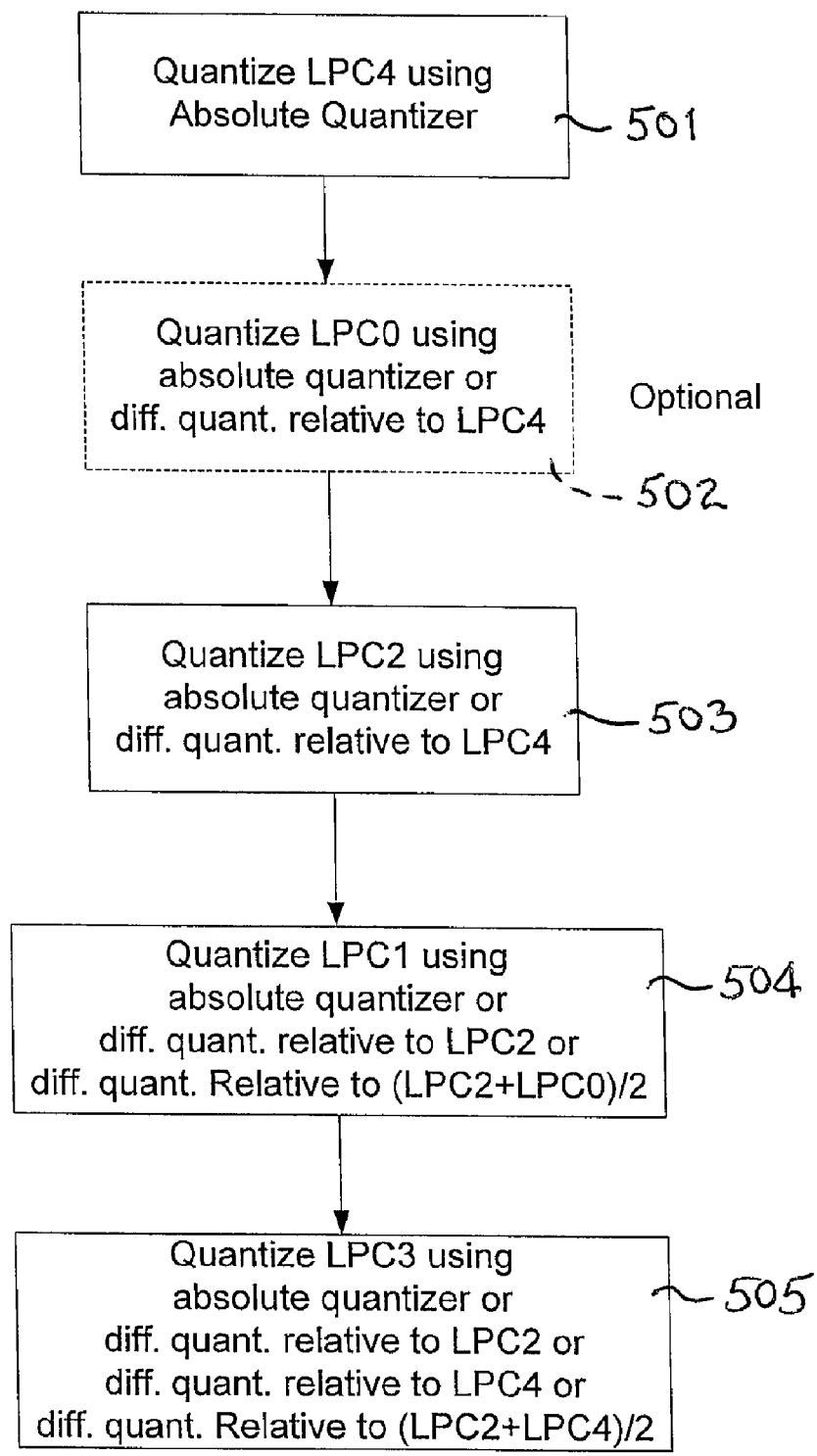
FIG. 5 is a flow chart illustrating an example of an out-of-the-loop quantization scheme.

FIG. 5 is a flow chart illustrating in more detail an example of an out-of-the-loop quantization scheme.

Operation 501: An absolute quantizer quantizes the filter LPC4.

Operation 502: Operation 512 is optional and used in a first LPC-based coding frame after a non-LPC-based coding frame. An absolute quantizer quantizes the filter LPC0 or a differential quantizer diffentially quantizes the filter LPC0 relative to the quantized filter LPC4. The filter LPC0 is the last LPC filter (LPC4) from the previous super-frame and can be used as a possible reference for quantizing the filters LPC1 to LPC4.

Operation 503: An absolute quantizer quantizes the filter LPC2 or a differential quantizer diffentially quantizes the filter LPC2 relative to the quantized filter LPC4 used as reference.

Operation 504: An absolute quantizer quantizes the filter LPC1, a differential quantizer diffentially quantizes the filter LPC1 relative to the quantized filter LPC2 used as reference, or a differential quantizer differentially quantizes the filter LPC1 relative to (quantized filter LPC2+quantized filter LPC0)/2) used as reference.

Operation 505: An absolute quantizer quantizes the filter LPC3, a differential quantizer diffentially quantizes the filter LPC3 relative to the quantized filter LPC2 used as reference, a differential quantizer differentially quantizes the filter LPC3 relative to quantized filter LPC4 used as reference, or a differential quantizer differentially quantizes the filter LPC3 relative to (quantized filter LPC2+quantized filter LPC4)/2) used as reference.

Figure 3:
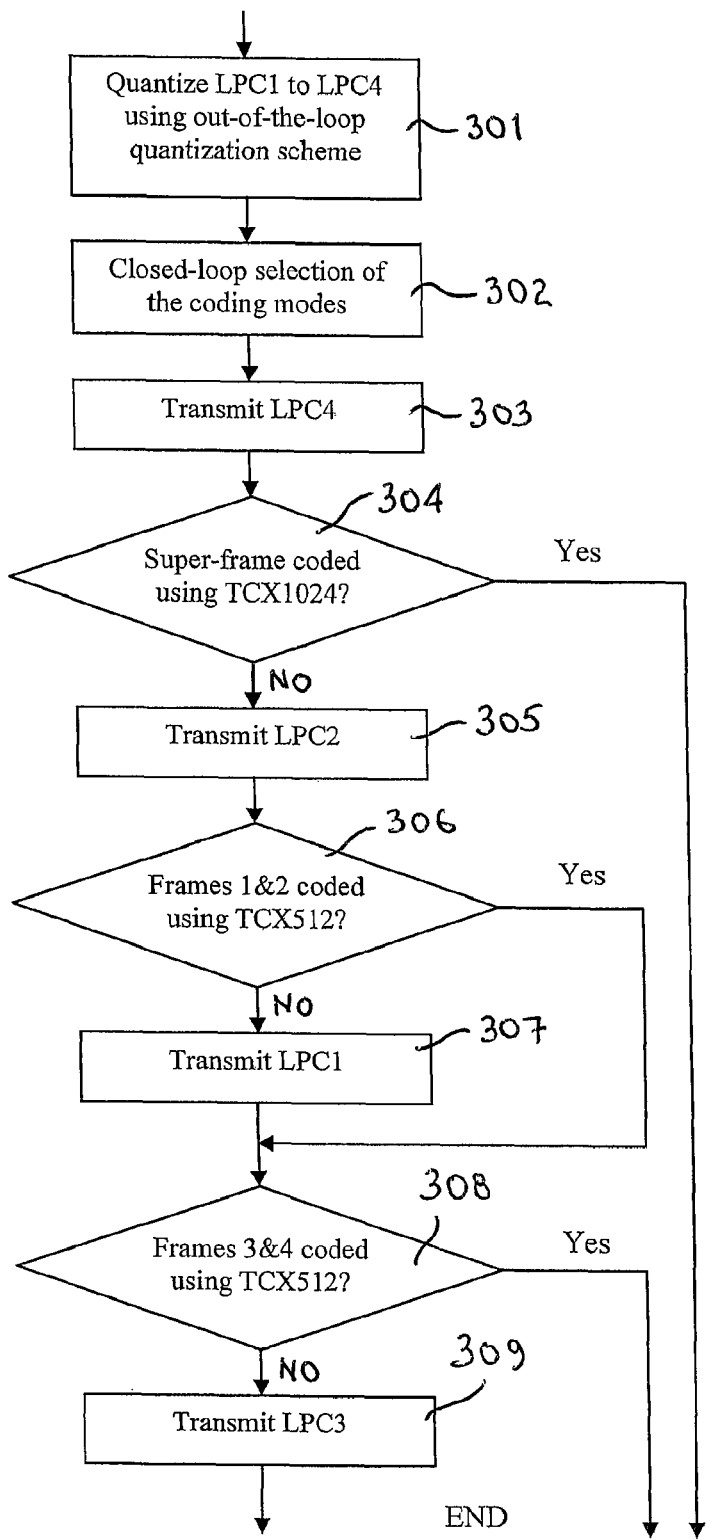
FIG. 3 is a flow chart illustrating a device and method for determining LPC filters to be transmitted in a configuration in which four (4) LPC filters are used and transmitted in a super-frame.

FIG. 3 is a flow chart illustrating determination of LPC filters to be transmitted in a configuration where four (4) LPC filters can be calculated and transmitted in a super-frame.

First of all it should be kept in mind that quantized filter LPC1 is transmitted only when ACELP and/or TCX256 is selected for the first half of the super-frame. Similarly, filter LPC3 is transmitted only when ACELP and/or TCX256 is used for the second half of that super-frame.

Operation 301: Filter LPC1 of frame 1 of the super-frame, filter LPC2 of frame 2 of the super-frame, filter LPC3 of frame 3 of the super-frame, and filter LPC4 of frame 4 of the super-frame are quantized using for example the quantization stategy illustrated and described in relation to FIGS. 2 and 5. Of course, other quantization strategies are possible.

Operation 302: Closed-loop selection of the coding modes as described hereinabove is performed.

Operation 303: The quantized filter LPC4 is transmitted to the decoder for example through the transmitter 105 of FIG. 1. The decoder comprises:
  means for receiving and extracting from the received bitstream, for example a demultiplexer, the quantized filter LPC4; and
  an absolute inverse quantizer supplied with the quantized filter LPC4 for inverse quantizing the quantized filter LPC4.

Operation 304: If the super-frame is coded using mode TCX1024, no further transmission is required.

Operation 305: If the first, second, third and fourth frames of the super-frame are not coded using mode TCX1024, the quantized filter LPC2 and an index indicative of one of the absolute quantization mode and the differential quantization mode are transmitted to the decoder for example through the transmitter 105 of FIG. 1. The decoder comprises:
  means for receiving and extracting from the received bitstream, for example a demultiplexer, the quantized filter LPC2 and the index indicative of one of the absolute quantization mode and the differential quantization mode; and
  an absolute inverse quantizer supplied with the quantized filter LPC2 and the index indicative of the absolute quantization mode for inverse quantizing the quantized filter LPC2, or a differential inverse quantizer supplied with the quantized filter LPC2 and the index indicative of the differential quantization mode for inverse quantizing the quantized filter LPC2.

Operation 306: If frames 1 and 2 of the super-frame are coded using mode TCX512, the quantized filter LPC1 is not transmitted to the decoder.

Operation 307: If frames 1 and 2 of the super-frame are not coded using mode TCX512, i.e. if frames 1 and 2 of the super-frame are coded using ACELP or TCX256, the quantized filter LPC1, and an index indicative of one of the absolute quantization mode, the differential quantization mode relative to quantized filter LPC2 used as reference, and the differential quantization mode relative to (quantized filter LPC2+quantized filter LPC0)/2 used as reference are transmitted to the decoder for example through the transmitter 105 of FIG. 1. The decoder comprises:
  means for receiving and extracting from the received bitstream, for example a demultiplexer, the quantized filter LPC1, and the index indicative of one of the absolute quantization mode, the differential quantization mode relative to quantized filter LPC2 used as reference, and the differential quantization mode relative to (quantized filter LPC2+quantized filter LPC0)/2 used as reference; and
  an absolute inverse quantizer supplied with the quantized filter LPC1 and the index indicative of one of the absolute quantization mode, the differential quantization mode relative to quantized filter LPC2 used as reference, and the differential quantization mode relative to (quantized filter LPC2+quantized filter LPC0)/2) used as reference for inverse quantizing the quantized filter LPC1.

Operation 308: If frames 3 and 4 of the super-frame are coded using mode TCX512, the quantized filter LPC3 is not transmitted to the decoder.

Operation 309: If frames 3 and 4 of the super-frame are not coded using mode TCX512, i.e. if frames 3 and 4 of the super-frame are coded using ACELP or TCX256, the quantized filter LPC3 and the index indicative of one of the absolute quantization mode, the differential quantization mode relative to quantized filter LPC2 used as reference, the differential quantization mode relative to quantized filter LPC4 used as reference, and the differential quantization mode relative to (quantized filter LPC2+quantized filter LPC4)/2 used as reference are transmitted to the decoder for example through the transmitter 105 of FIG. 1. The decoder comprises:
  means for receiving and extracting from the received bitstream, for example a demultiplexer, the quantized filter LPC3, and the index indicative of one of the absolute quantization mode, the differential quantization mode relative to quantized filter LPC2 used as reference, the differential quantization mode relative to quantized filter LPC4 used as reference, and the differential quantization mode relative to (quantized filter LPC2+quantized filter LPC4)/2 used as reference; and
  an absolute inverse quantizer supplied with the quantized filter LPC3 and the index indicative of one of the absolute quantization mode, the differential quantization mode relative to quantized filter LPC2 used as reference, the differential quantization mode relative to quantized filter LPC4 used as reference, and the differential quantization mode relative to (quantized filter LPC2+quantized filter LPC4)/2 used as reference for inverse quantizing the quantized filter LPC3.

Some benefits of the above described solution comprise:
Quantizing the whole set of LPC filters prior to the closed-loop selection of the coding modes saves complexity;
Using a differential quantizer in the global quantization scheme preserves some of the bit rate saving that was gained by, for example, the predictive quantizer in the original AMR-WB+ quantization scheme.

The following variants can be used to build the reference LPC filters that are used in the differential quantizers (Operations such as $103_1, 103_2, \ldots, 103_n$):
  If inter super-frame dependency is not an issue, the last LPC filter (LPC4) from the previous super-frame (LPC0) can be used as a possible reference for encoding the filters LPC1 to LPC4;
  When different reference LPC filters are available, for example filter LPC0 and LPC4 when coding filter LPC2, a specific bit pattern can be transmitted to the decoder to indicate which of the references is actually used. For example, selection of the reference can be performed as described hereinabove with reference to FIG. 1, for example on the basis of a distance or a bit rate measurement.
  When different reference LPC filters are available, additional secondary reference LPC filters can be obtained by applying various extrapolations or interpolations schemes to the already available reference LPC filters. A specific bit pattern can be transmitted to indicate the actual interpolation or extrapolation strategy selected by the coder. For example, filter LPC3 can be quantized differentially with respect to the quantized versions of either filter LPC2 or LPC4, or even with respect to an interpolated value (e.g. average) between these two quantized filters LPC2 and LPC4 (see Operation 505 of FIG. 5).

The above described "out-of-the loop" quantization scheme can be extended to coding more than four (4) LPC filters: for example to quantize and transmit filter LPC0 together with the super-frame. In that case, filter LPC0 corresponding to the last LCP filter (LPC4) calculated during the previous super-frame could be, as a non-limitative example, be quantized relative to filter LPC4 since this filter LPC4 is always available as a reference. Quantized filter LPC0 is transmitted to the decoder along with an index indicative of one of the absolute quantization mode and the differential quantization mode. The decoder comprises comprises:
  means for receiving and extracting from the received bitstream, for example a demultiplexer, the quantized filter LPC0, and the index indicative of one of the absolute quantization mode and the differential quantization mode; and
  an absolute inverse quantizer supplied with the quantized filter LPC0 and the index indicative of the absolute quantization mode for inverse quantizing the quantized filter LPC0, or a differential inverse quantizer supplied with the quantized filter LPC0, and the index indicative of the differential quantization mode for inverse quantizing the quantized filter LPC0.

Transmitting filter LPC0 to the decoder is useful to initialize an LPC-based codec in the case of switching from a non-LPC-based coding mode to an LPC-based coding mode. Examples of non-LPC-based coding modes are: pulse code modulation (PCM), and transform coding used for example by MP3 and by the advanced audio codec AAC. Examples of LPC-based coding modes are: code excited linear prediction (CELP) and algebraic CELP (ACELP) used by the AMR-WB+ codec [1].

Figure 4:
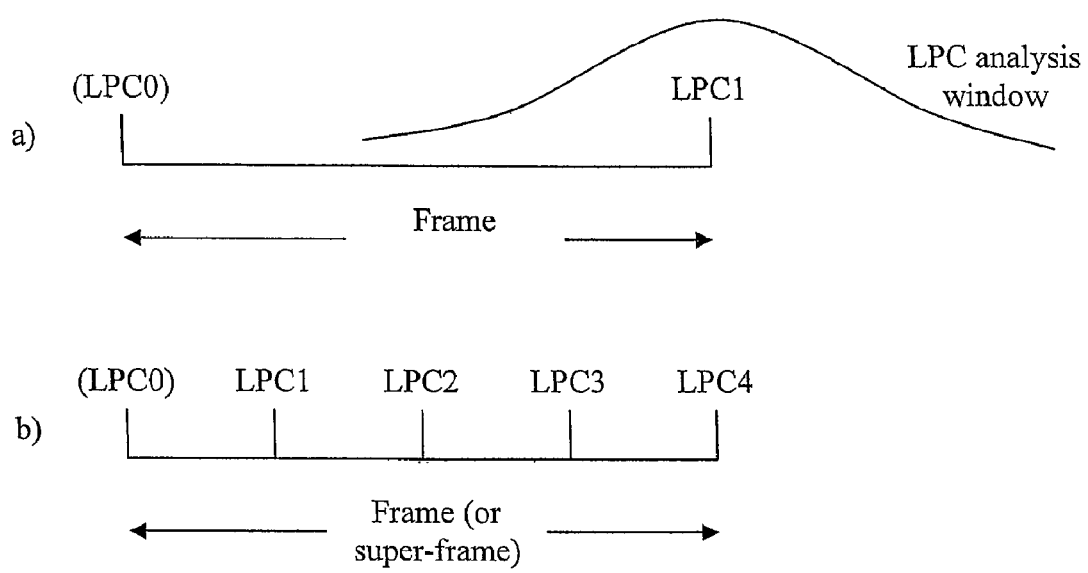
FIG. 4a is a typical LPC analysis window and typical LPC analysis center position when one LPC filter is estimated per frame (or super-frame) in an LPC-based codec, wherein LPC0 corresponds to a last LPC filter of the previous frame (or super-frame)
FIG. 4b is a typical LPC analysis window when four (4) LPC filters are estimated per frame (or super-frame) in an LPC-based codec, wherein the LPC analysis window is centered at the end of the frame.

In LPC-based codecs, one or several LPC filters per frame (or per super-frame) are estimated and transmitted to the decoder. When one single LPC filter per frame is estimated and transmitted, this LPC filter is most often estimated using an LPC analysis window centered on the end of the frame as represented in FIG. 4a. When several LPC filters are transmitted per frame (or per super-frame as in the AMR-WB+ codec), they are most often estimated at regularly spaced positions over the length of the frame as represented on FIG. 4b. Filter LPC0 in FIGS. 4a and 4b is in fact the last LPC filter of the previous frame (or super-frame) which is quantized and transmitted to the decoder.

Typical LPC-based codecs generally use interpolated values for the LPC filters. In the example of FIG. 4a, for example, the LPC-based codec would typically divide the frame into four (4) sub-frames and use a different interpolated LPC filter for each sub-frame, the LPC filter of the first sub-frame being closer to filter LPC0 and the LPC filter of the $4^{th}$ sub-frame being closer to filter LPC1.

In a codec which switches from a non-LPC-based coding mode to an LPC-based coding mode, the filter LPC0 used to operate the LPC-based codec is normally not available at the first frame following the switch from the non-LPC-based coding mode to the LPC-based coding mode.

In that context, it is proposed to provide a value for filter LPC0 which is available both at the coder and the decoder when coding and decoding the first frame after the switch from the non-LPC-based coding mode to the LPC-based coding mode. More specifically, the value of the filter LPC0 is obtained at the decoder from the parameters transmitted from the coder.

According to a first solution, the filter LPC0 is determined at the coder (using LPC analysis well-know to those of ordinary skill in the art), quantized and transmitted to the decoder after the switch from the non-LPC-based coding mode to the LPC-based coding mode has been decided. The decoder uses the transmitted quantized value and the filter LPC0. To quantize the filter LPC0 efficiently, the out-of-the-loop quantization scheme as described above, extended to more than four (4) LPC filters can be used.

The following describes second and third solutions to estimate the filter LPC0 at the decoder from transmitted parameters:

Estimation of the filter LPC0 from the other transmitted LPC filters using, for example, extrapolation; and Estimation of the filter LPC0 from the other transmitted parameters. For example the filter LPC0 can be estimated by applying the conventional LPC analysis procedure to the past decoded signal, more specifically the output of the switched decoder prior to the switch from the non-LPC-based coding mode to the LPC-based coding mode.

Quantization with a Uniform Algebraic Vector Quantizer

The principle of stochastic vector quantization is to search a codebook of vectors for the nearest neighbor (generally in terms of Euclidian distance or weighted Euclidian distance) of the vector to be quantized. When quantizing LPC filters in the LSF (Line Spectral Frequency) or ISF (Immitance Spectral Frequency) domains, a weighting Euclidian distance is generally used, each component of the vector being weighted differently depending on its value and the value of the other components [5]. The purpose of that weighting is to make the minimization of the Euclidian distance behave as closely as possible to a minimization of the spectral distortion. Unlike a stochastic quantizer, a uniform algebraic vector quantizer does not perform an exhaustive search of a codebook. It is therefore difficult to introduce a weighting function in the distance computation.

In the solution proposed herein, the LPC filters are quantized, as a non-limitative example, in the LSF domain. Appropriate means for converting the LPC filter in the LSF quantization domain to form the input LSF vector are therefore provided. More specifically, the LSF residual vector, i.e. the difference between the input LSF vector and a first-stage approximation of this input LSF vector, is warped using a weighting function computed from the first-stage approximation, wherein the first-stage approximation uses a stochastic absolute quantizer of the input LSF vector, a differential quantizer of the input LSF vector, an interpolator of the input LSF vector, or other element that gives an estimate of the input LSF vector to be quantized. Warping means that different weights are applied to the components of the LSF residual vector. Because the first-stage approximation is also available at the decoder, the inverse weights can also be computed at the decoder and the inverse warping can be applied to the quantized LSF residual vector. Warping the LSF residual vector according to a model that minimizes the spectral distortion is useful when the quantizer is uniform. The quantized LSFs received at the decoder are a combination of the first-stage approximation with a variable bit rate quantization, for example AVQ (Algebraic Vector Quantization), refinement which is inverse-warped at the decoder.

Some benefits of the proposed solution are the following:

With a good weighting function, a uniform quantizer can provide a relatively uniform spectral distortion.

The advantages of variable bit rate vector quantization, for example AVQ (Algebraic Vector Quantization), over SVQ (Stochastic Vector Quantization) are a smaller number of tables (memory), less complexity and higher bit-rate granularity.

Another advantage in favor of variable bit rate vector quantization, for example AVQ (Algebraic Vector Quantization), is its unlimited codebook size; this guarantees the same spectral distortion for any type of signal.

Figure 6:
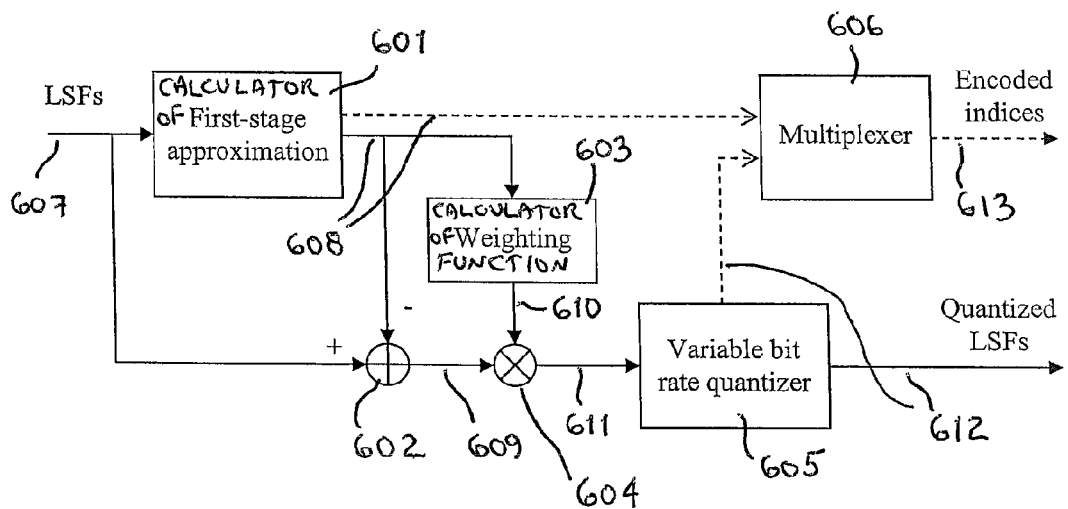
FIG. 6 is a schematic block diagram of a weighted algebraic LPC quantizer and quantizing method.

The general principle for the quantization of a given LPC filter is given in FIG. 6. In this non-limitative example, the LPC filter is quantized in the LSF domain.

Operation 601: A calculator computes a first-stage approximation 608 of the input LSF vector 607.

Operation 602: A subtractor subtracts the first-stage approximation 608 from Operation 601 from the input LSF vector 607 to produce a residual LSF vector 609.

Operation 603: A calculator derives a LSF weighting function 610 from the first-stage approximation 608 of Operation 601.

Operation 604: A multiplier, or warper, applies the LSF weighting function 610 from Operation 603 to the residual LSF vector 609 from Operation 602.

Operation 605: A variable bit rate quantizer, for example an algebraic vector quantizer (AVQ) quantizes the resulting weighted residual LSF vector 611 to supply a quantized weighted residual LSF vector 612.

Operation 606: A multiplexer is responsive to the first-stage approximation 608 from Operation 601 and the quantized weighted residual LSF vector 612 from Operation 605 to multiplex and transmit the corresponding coded indices 613.

The first-stage approximation (Operation 601) can be calculated in different ways. As a non-limitative example, the calculator of the first-stage approximation 608 can be an absolute stochastic vector quantizer of the input LSF vector 607 with a small number of bits, or a differential quantizer of the input LSF vector 607 using a reference as explained above where the first-stage approximation is the reference itself. For example, when quantizing the vector LPC1 as in FIG. 5, Operation 504, the calculator of the first-stage approximation 608 can be an absolute quantizer with 8 bits, or quantized filter LPC2 or (quantized filter LPC2+quantized filter LPC0)/2.

The calculation and purpose of the weighting function (Operation 603) is described herein below.

Figure 7:
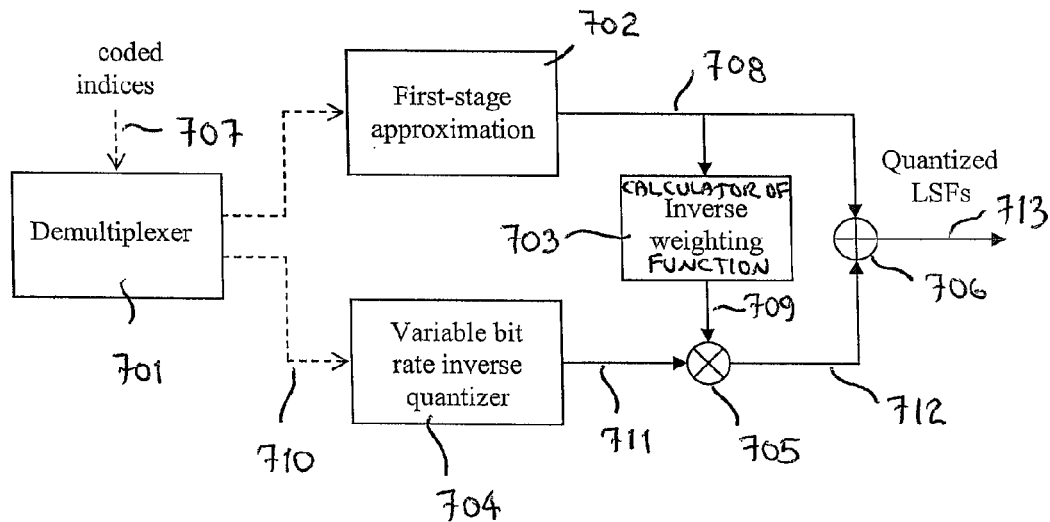
FIG. 7 is a schematic block diagram of a weighted algebraic LPC inverse quantizer and quantizing method.

The corresponding inverse quantizer is illustrated in FIG. 7.

Operation 701: The coded indices 707 from the coder are demultiplexed by a demultiplexer.

Operation 702: The demultiplexed coded indices include the first-stage approximation 708.

Operation 703: Since the first-stage approximation is available at the decoder as at the coder (Operation 702), a calculator can be used to calculate the inverse LSF weighting function 709.

Operation 704: Decoded indices 710 representative of the quantized weighted residual LSF vector are supplied to a variable bit rate inverse vector quantizer, for example an algebraic inverse vector quantizer (inverse AVQ) to recover the weighted residual LSF vector 711.

Operation 705: A multiplier multiplies the weighted residual LSF vector 711 from Operation 704 by the inverse LSF weighting function 709 from Operation 703 to recover the residual LSF vector 712.

Operation 706: An adder sums the first-stage approximation 708 from Operation 702 with the residual LSF vector 712 from Operation 705 to form the decoded LSF vector 713. The decoded LSF vector 713 is a combination of the first-stage approximation from Operation 702 with the variable bit rate inverse quantization refinement (Operation 704) which is inverse-weighted (Operation 705) at the decoder.

First-Stage Approximation

As explained above a given LPC filter can be quantized using several quantization modes including absolute quantization and differential quantization using several references. The first-stage approximation depends on the quantization mode. In the case of absolute quantization, the first-stage approximation can use a vector quantizer with a small number of bits (e.g. 8 bits). In the case of differential quantization, the first-stage approximation constitutes the reference itself. For example, when quantizing the vector LPC3 as illustrated in FIG. 5 (Operation 505), the first-stage approximation can be one of the following:

- 8-bit VQ (absolute quantization);
- Quantized filter LPC2 (differential quantization using quantized filter LPC2 as reference);
- Quantized filter LPC4 (differential quantization using quantized filter LPC4 as reference); or
- Average of quantized filters LPC2 and LPC4 (differential quantization using (quantized filter LPC2+quantized filter LPC4)/2 as reference).

As a non-limitative example, in the case of a p-th order LPC filter expressed with LSF parameters, in the absolute quantization mode, the first-stage approximation is calculated using a p-dimensional, 8-bit stochastic vector quantizer applied to the input LSF vector. A codebook search uses a weighted Euclidian distance in which each component of the squared difference between the input LSF vector and the codebook entry is multiplied by the weight wt(i). For example, the weight wt(i) can be given by the following expression:

$$wt(i) = \frac{1}{d_i} + \frac{1}{d_{i+1}},$$
$$i = 0, \ldots, p-1$$

with:

$$d_0 = f(0)$$

$$d_p = SF/2 - f(p-1)$$

$$d_i = f(i) - f(i-1), i=1, \ldots, p-1$$

where f(i), i=0, . . . , p−1 is the input LSF vector to be quantized, p is the order of LP analysis, and SF is the internal sampling frequency of the LPC-based codec (in Hz).

In the differential quantization modes, the first-stage approximation is based on already quantized LPC filters.

As explained with reference to FIG. 5, the set of LPC filters is quantized in the following order: LPC4, LPC2, LPC1 and then LPC3. When required, the optional filter LPC0 is quantized after the filter LPC4. Therefore differential quantization of filter LPC2 can only be done with respect to LPC4, while differential quantization of filter LPC3 can be done with respect to LPC2, LPC4 or a combination of both LPC2 and LPC4; LPC1 is not considered a good choice because it is not adjacent to LPC3.

For each first-stage approximation $f_{1St}(i)$, the residual LSF vector is calculated as:

$$r(i) = f(i) - f_{1St}(i), i=0, \ldots, p-1$$

As shown in FIG. 6, the residual LSF vector 609 from Operation 602 is weighted (Operation 604) with the weighting function 610 from Operation 603 computed based on the first-stage approximation $f_{1St}(i)$ to obtain a warped residual LSF vector 611 (Operation 604). The warped residual LSF vector 611 is then quantized using a variable bit rate quantizer, for example an algebraic vector quantizer (Operation 605).

For example, the weights applied to the components of the p-th residual LSF vector can be given by the following relation:

$$wt(i) = \frac{1}{W} * \frac{400}{\sqrt{d_i \cdot d_{i+1}}},$$
$$i = 0, \ldots, p-1$$

with:

$$d_0 = f_{1St}(0)$$

$$d_p = SF/2 - f_{1St}(p-1)$$

$$d_i = f_{1St}(i) - f_{1St}(i-1), i=1, \ldots, p-1$$

where $f_{1St}(i)$ is the first-stage approximation, SF is the internal sampling frequency in Hz of the LPC-based codec, and W is a scaling factor which depends on the quantization mode. The value of W is chosen in order to obtain a certain target spectral distortion and/or a certain target average bit rate once the warped residual LSF vector is quantized with the variable bit rate quantizer. As a non-limitative example, the variable bit rate vector quantizer chooses the bit rate for a certain vector based on its average energy.

In an illustrative example, the four (4) LPC filters in a super-frame, as well as the optional LPC0 filter are quantized according to FIG. 5. Table 2 shows the used scaling factor for each quantization mode, and the encoding of the mode index used in this example. Note that the quantization mode specifies which of the absolute or differential quantization is used, and in case of differential quantization it specifies the used reference filter. As explained above the reference filter used in differential quantization is the actual first-stage approximation for variable bit rate quantizing.

TABLE 2

Possible absolute and relative quantization modes and corresponding bitstream signaling, and the scaling factor and the weighting function

| Filter | Quantization mode | First stage approximation | Encoded mode | W |
|---|---|---|---|---|
| LPC4 | Absolute | 8-bit VQ | (none) | 60 |
| LPC0 | Absolute | 8-bit VQ | 0 | 60 |
|  | Relative LPC4 | Quantized LPC4 | 1 | 63 |
| LPC2 | Absolute | 8-bit VQ | 0 | 60 |
|  | Relative LPC4 | Quantized LPC4 | 1 | 63 |
| LPC1 | Absolute | 8-bit VQ | 00 | 60 |
|  | Relative (LPC0 + LPC2)/2 (Note 1) | Quantized (LPC0 + LPC2)/2 | 01 | 65 |
|  | Relative LPC2 | Quantized LPC2 | 10 | 64 |
| LPC3 | Absolute | 8-bit VQ | 10 | 60 |
|  | Relative (LPC2 + LPC4)/2 | Quantized (LPC2 + LPC4)/2 | 0 | 65 |
|  | Relative LPC2 | Quantized LPC2 | 110 | 64 |
|  | Relative LPC4 | Quantized LPC4 | 111 | 64 |

(Note 1):
in this mode, there is no second-stage AVQ quantizer

Figure 8:
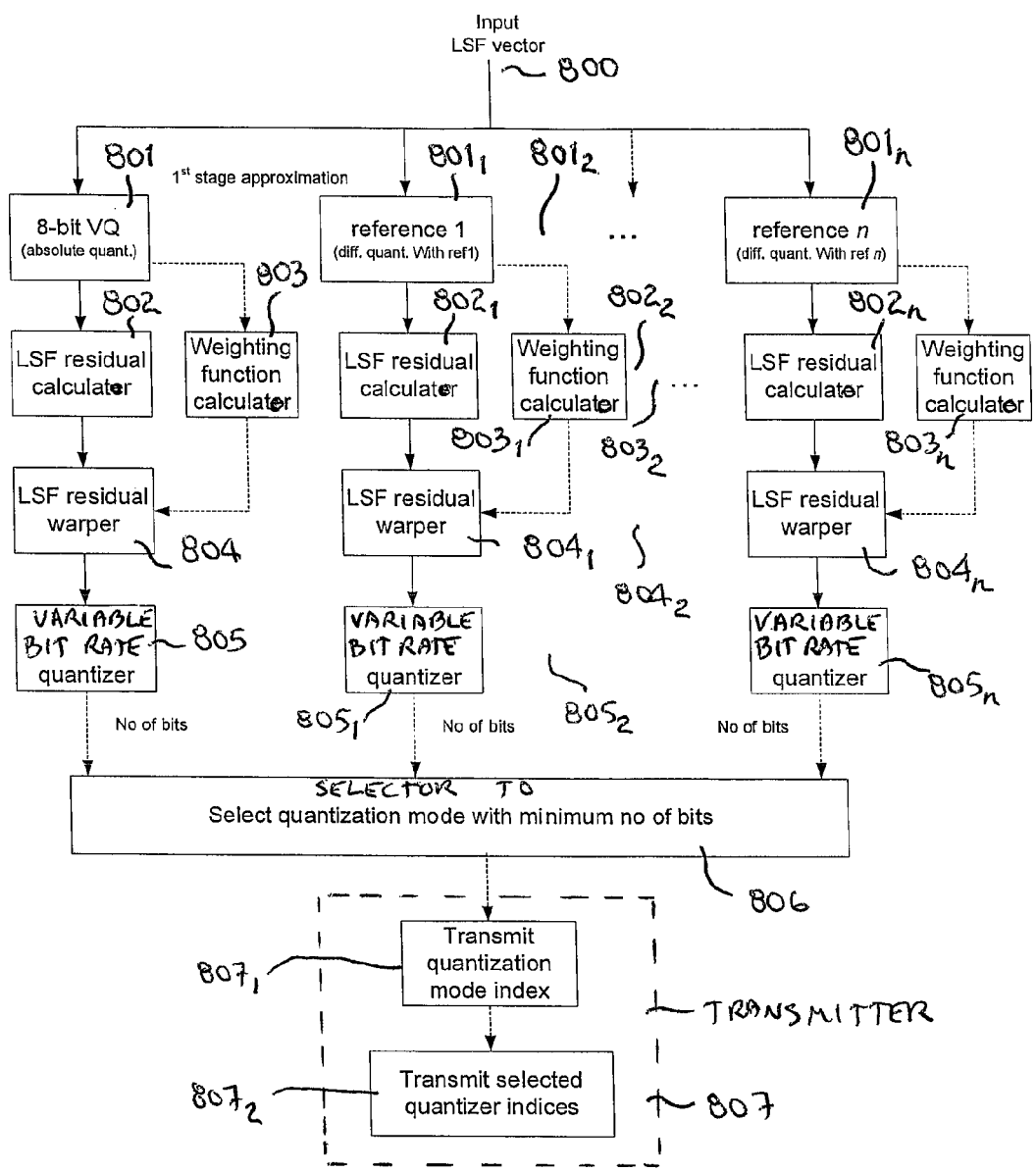
FIG. 8 is a schematic block diagram of a quantizer and quantizing method.

FIG. 8 is a schematic block diagram explaining the quantization procedure as described herein above.

Operations 801, $801_1$, $801_2$, . . . , $801_n$: The input LSF vector 800 is supplied to an absolute quantizer (Operation 801) for performing, for example, a 8-bit absolute vector quantization of the input LSF vector 800. The input LSF vector is also supplied to differential quantizers (Operations $801_1$, $801_2$, . . . , $801_n$) for performing differential quantization of the input LSF vector 800. The differential quantizers use respective, different references as explained in the foregoing description with reference to FIG. 1. The 8-bit VQ in Operation 801 and references in Operations $801_1, 801_2, \ldots, 801_n$ represent the first-stage approximation.

In Operations 802, $802_1, 802_2, \ldots, 802_n$, a calculator calculates a residual LSF vector from the first stage approximation vector from the Operations 801, $801_1, 801_2, \ldots, 801_n$, respectively. The residual vector is calculated as the difference between the input vector and the first-stage approximation. This corresponds to Operations 601 and 602 of FIG. 6.

In Operations 803, $803_1, 803_2, \ldots, 803_n$, a calculator calculates a weighting function to warp the residual LSF vector from the Operations 802, $802_1, 802_2, \ldots, 802_n$, respectively. This corresponds to Operations 601 and 603 of FIG. 6.

In Operations 804, $804_1, 804_2, \ldots, 804_n$, a warper multiplies the residual LSF vector from the Operations 802, $802_1, 802_2, \ldots, 802_n$, respectively, by the weighting function from the Operations 803, $803_1, 803_2, \ldots, 803_n$, respectively.

In Operations 805, $805_1, 805_2, \ldots, 805_n$, a variable bit rate quantizer, for example an algebraic vector quantizer (AVQ) quantizes the resulting weighted residual LSF vector from the Operations 804, $804_1, 804_2, \ldots, 804_n$, respectively, to supply a quantized weighted residual LSF vector.

In Operation 806, the selection of a quantization mode is performed by a selector amongst absolute quantization (Operation 801) and differential quantization using one of the references 1, 2, ..., n (Operations $801_1, 801_2, \ldots, 801_n$). For example, Operation 806 could select the quantization mode (Operations 801, $801_1, 801_2, \ldots, 801_n$) that yields a lower distortion for a given bit rate or the lower bit rate for a target level of distortion. Regarding the selection amongst 8-bit VQ and references 1, 2, ..., n, the selection can be performed in closed-loop or in open-loop. In closed-loop, all possible references are tried and the reference that optimizes a certain criterion of distortion or bit rate is chosen, for example the lower distortion for a given bit rate or the lower bit rate for a target level of distortion. In open-loop, the Operation 806 predetermines the reference based on the value of the Linear Prediction Coefficients of the LPC filter to be quantized and of the Linear Prediction Coefficients of the available reference LPC filters.

Operation 807: Following the selection in Operation 806, a transmitter (Operation 807) communicates or signals to the decoder (not shown) an index indicative of:
- the quantization mode (sub-operation $807_1$), for example absolute or differential quantization; and
- in the case of differential quantization, of the selected reference and associated differential quantizer of Operations $801_1, 801_2, \ldots, 801_n$ (sub-operation $807_2$).

Some specific bits are transmitted to the decoder for such signaling.

Algebraic Vector Quantizer

A possible algebraic vector quantizer (AVQ) used for example in Operation 605 of FIG. 6 and Operations 805, $805_1, 805_2, \ldots, 805_n$ of FIG. 8 is based on the 8-dimensional RE8 lattice vector quantizer used to quantize the spectrum in TCX modes of AMR-WB+ [1].

For a $16^{th}$ order LPC, each weighted residual LSF vector is split into two 8-dimensional sub-vectors $B_1$ and $B_2$. Each of these two sub-vectors is quantized using the three-operation approach described below.

LSF vectors do not have all the same sensitivity to quantization error, whereby a certain quantization error applied to one LSF vector can have more impact on spectral distortion than the same quantization error applied to another LSF vector. The weighting operation gives the same relative sensitivity to all weighted LSF vectors. The AVQ has the particularity of introducing the same level of quantization error to the weighted LSF vectors (uniform quantization error). When performing the inverse quantization, the inverse weighting which is applied to inverse-quantized weighted LSF vectors is also obviously applied to the quantization error. Thus, the originally uniform quantization error is distributed among quantized LSF vectors, the more sensitive LSF vectors acquiring a smaller quantization error and the less sensitive LSF vectors acquiring a larger quantization error. As a consequence, the impact of quantization error on spectral distortion is minimized.

As explained in Reference [1], the RE8 quantizer uses a fixed and predetermined quantization. As a consequence, the bit rate required to encode a subvector increases with the amplitude of this subvector.

The scaling factor W controls the amplitude of the weighted LSF vectors. Therefore, the scaling factor W also controls both the bit rate needed to quantize the LSF vector and the average spectral distortion.

First Operation: Find Nearest Neighbor in Lattice $RE_8$

In this first operation, an 8-dimensional sub-vector $B_k$ is rounded as a point in the lattice $RE_8$, to produce its quantized version, $\hat{B}_k$. Before looking at the quantization procedure, it is worthwhile to look at the properties of this lattice. The lattice $RE_8$ is defined as follows:

$$RE_8 = 2D_8 \cup \{2D_8 + (1, \ldots, 1)\}$$

that is as the union of a lattice $2D_8$ and a version of the lattice $2D_8$ shifted by the vector $(1,1,1,1,1,1,1,1)$. Therefore, searching for the nearest neighbour in the lattice $RE_8$ is equivalent to searching for the nearest neighbour in the lattice $2D_8$, then searching for the nearest neighbour in the lattice $2D_8+(1,1,1,1,1,1,1,1)$, and finally selecting the best of those two lattice points. The lattice $2D_8$ is the lattice $D_8$ scaled by a factor of 2, with the lattice $D_8$ defined as:

$$D_8 = \{(x_1, \ldots, x_8) \in Z^8 | x_1 + \ldots + x_8 \text{ is even}\}$$

That is, the points in the lattice $D_8$ are all integers, with the constraint that the sum of all components is even. This also implies that the sum of the components of a point in lattice $2D_8$ is an integer multiple of 4.

From this definition of lattice $RE_8$, it is straightforward to develop a fast algorithm to search for the nearest neighbour of an 8-dimensional sub-vector $B_k$ among all lattice points in lattice $RE_8$. This can be done by applying the following operations. The components of sub-vector $B_k$ are floating point values, and the result of the quantization, $\hat{B}_k$, will be a vector of integers.

1. $z_k = 0.5 * B_k$
2. Round each component of $z_k$ to the nearest integer, to generate $\bar{z}_k$
3. $y1_k = 2\bar{z}_k$
4. Calculate S as the sum of the components of $y1_k$
5. If S is not an integer multiple of 4 (negative values are possible), then modify one of its components as follows:
   find the position I where $abs(z_k(i) - y1_k(i))$ is the highest
   if $z_k(I) - y1_k(I) < 0$, then $y1_k(I) = y1_k(I) - 2$
   if $z_k(I) - y1_k(I) > 0$, then $y1_k(I) = y1_k(I) + 2$
6. $z_k = 0.5 * (B_k - 1.0)$ where 1.0 denotes a vector in which all the components are 1's
7. Round each component of $z_k$ to the nearest integer, to generate $\bar{z}_k$
8. $y2_k = 2\bar{z}_k$
9. Calculate S as the sum of the components of $y2_k$ 10. If S is not an integer multiple of 4 (negative values are possible), then modify one of its components as follows: find the position I where abs($z_k(I)-y2_k(I)$) is the highest
   if $z_k(I)-y2_k(I)<0$, then $y2_k(I)=y2_k(I)-2$
   if $z_k(I)-y2_k(I)>0$, then $y2_k(I)=y2_k(I)+2$
11. $y2_k=y2_k+1.0$
12. Compute $e1_k=(B_k-y1_k)^2$ and $e2_k=(B_k-y2_k)^2$
13. If $e1_k>e2_k$, then the best lattice point (nearest neighbour in the lattice) is $y1_k$ otherwise the best lattice point is $y2_k$.
$\hat{B}_k=c_k$ where $c_k$ is the best lattice point as selected above.

Second Operation: Computation of the Indices

In the first operation, each 8-dimensional sub-vector $B_k$ was rounded as a point in the lattice $RE_8$. The result is $\hat{B}_k=c_k$, the quantized version of $B_k$. In the present second operation an index is computed for each $c_k$ for transmission to the decoder. The computation of this index is performed as follows.

The calculation of an index for a given point in the lattice $RE_8$ is based on two basic principles:

1. All points in the lattice $RE_8$ lie on concentric spheres of radius $\sqrt{8m}$ with m=0, 1, 2, 3, etc., and each lattice point on a given sphere can be generated by permuting the coordinates of reference points called leaders. There are very few leaders on a sphere, compared to the total number of lattice points which lie on the sphere. Codebooks of different bit rates can be constructed by including only spheres up to a given number m. See Reference [6] for more details, where codebooks $Q_0$, $Q_1$, $Q_2$, $Q_3$, $Q_4$, and $Q_5$ are constructed with respectively 0, 4, 8, 12, 16 and 20 bits. Hence, codebook $Q_n$ requires 4n bits to index any point in that codebook.

2. From a base codebook C (i.e. a codebook containing all lattice points from a given set of spheres up to a number m), an extended codebook can be generated by multiplying the elements of the base codebook C by a factor M, and adding a second-stage codebook called the Voronoi extension. This construction is given by y=Mz+v, where M is the scale factor, z is a point in the base codebook and v is the Voronoi extension. The extension is computed in such a way that any point y=M z+v is also a point in the lattice $RE_8$. The extended codebook includes lattice points that extend further out from the origin than the base codebook.

In the present case, the base codebook C in the LPC quantizer can be either codebook $Q_0$, $Q_2$, $Q_3$ or $Q_4$ from Reference [6]. When a given lattice point $c_k$ is not included in these base codebooks, the Voronoi extension is applied, using this time only the codebook $Q_3$ or $Q_4$. Note that here, $Q_2 \subset Q_3$ but $Q_3 \not\subset Q_4$.

Then, the calculation of the index for each lattice point $c_k$, obtained in the first operation, is performed according to the following operations.

Verify if $c_k$ is in the base codebook C. This implies verifying if $c_k$ is an element of codebooks $Q_0$, $Q_2$, $Q_3$ or $Q_4$ from Reference [6].

If $c_k$ is an element of the base codebook C, the index used to encode $c_k$ is thus the codebook number $n_k$ plus the index $I_k$ of the codevector $c_k$ in the codebook $Q_{n_k}$. The codebook number $n_k$ is encoded as described in a third operation. The index $I_k$ indicates the $ran_k$ of the codevector $c_k$, i.e. the permutation to be applied to a specific leader to obtain $c_k$ (see Reference [7]). If $n_k=0$, then $I_k$ uses no bits. Otherwise, the index $I_k$ uses $4n_k$ bits.

If $c_k$ is not in the base codebook, then apply the Voronoi extension through the following sub-operations, using this time only the codebook $Q_3$ or $Q_4$ as the base codebook.

V0 Set the extension order r=1 and the scale factor $M=2^r=2$.

V1 Compute the Voronoi index k of the lattice point $c_k$. The Voronoi index k depends on the extension order r and the scale factor M. The Voronoi index is computed via modulo operations such that k depends only on the relative position of $c_k$ in a scaled and translated Voronoi region:

$k=\text{mod}_M(c_k G^{-1})$.

where G is the generator matrix and $\text{mod}_M(.)$ is the component-wise modulo-M operation. Hence, the Voronoi index k is a vector of integers with each component comprised in the interval 0 to M−1.

V2 Compute the Voronoi codevector v from the Voronoi index k. This can be implemented using an algorithm as described in reference [8].

V3 Compute the difference vector $w=c_k-v$. This difference vector w always belongs to the scaled lattice $m\Lambda$, where $\Lambda$ is the lattice $RE_8$. Compute z=w/M, i.e., apply the inverse scaling to the difference vector w. The codevector z belongs to the lattice $\Lambda$ since w belongs to $M\Lambda$.

V4 Verify if z is in the base codebook C (i.e. in $Q_3$ or $Q_4$)
If z is not in the base codebook C, increment the extension order r by 1, multiply the scale factor M by 2, and go back to sub-operation V1. Otherwise, if z is in the base codebook C, then an extension order r and a scaling factor $M=2^r$ sufficiently large to encode the index of $c_k$ has been found. The index is formed of three parts: 1) the codebook number $n_k$ as a unary code defined below; 2) the $ran_k I_k$ of z in the corresponding base codebook (either $Q_3$ or $Q_4$); and 3) the 8 indices of the Voronoi index vector k calculated in sub-operation V1, where each index requires exactly r bits (r is the Voronoi extension order set in sub-operation V0). The codebook number $n_k$ is encoded as described in the third operation.

The lattice point $c_k$ is then described as:

$c_k=Mz+v$.

Third Operation. Variable Length Coding of the Codebook Numbers

The codebook numbers $n_k$ are encoded using a variable-length code which depends on the position of the LPC filter and on the quantization mode, as indicated in Table 3.

TABLE 3

Coding modes for codebook numbers $n_k$

| Filter | Quantization mode | $n_k$ mode |
|---|---|---|
| LPC4 | Absolute | 0 |
| LPC0 | Absolute | 0 |
|  | Relative LPC4 | 3 |
| LPC2 | Absolute | 0 |
|  | Relative LPC4 | 3 |
| LPC1 | Absolute | 0 |
|  | Relative (LPC0 + LPC2)/2 | 1 |
|  | Relative LPC2 | 2 |
| LPC3 | Absolute | 0 |
|  | Relative (LPC2 + LPC4)/2 | 1 |
|  | Relative LPC2 | 2 |
|  | Relative LPC4 | 2 |

$n_k$ modes 0 and 3:

The codebook number $n_k$ is encoded as a variable length code, as follows:
$Q_2 \to$ the code for $n_k$ is 00
$Q_3 \to$ the code for $n_k$ is 01

$Q_4 \rightarrow$ the code for $n_k$ is 10
Others: the code for $n_k$ is 11 followed by:
$Q_5 \rightarrow 0$
$Q_6 \rightarrow 10$
$Q_0 \rightarrow 110$
$Q_7 \rightarrow 1110$
$Q_8 \rightarrow 11110$
etc.

$n_k$ Mode 1:

The codebook number $n_k$ is encoded as a unary code, as follows:
$Q_0 \rightarrow$ unary code for $n_k$ is 0
$Q_2 \rightarrow$ unary code for $n_k$ is 10
$Q_3 \rightarrow$ unary code for $n_k$ is 110
$Q_4 \rightarrow$ unary code for $n_k$ is 1110
etc.

$n_k$ Mode 2:

The codebook number $n_k$ is encoded as a variable length code, as follows:
$Q_2 \rightarrow$ the code for $n_k$ is 00
$Q_3 \rightarrow$ the code for $n_k$ is 01
$Q_4 \rightarrow$ the code for $n_k$ is 10
Others: the code for $n_k$ is 11 followed by:
$Q_0 \rightarrow 0$
$Q_5 \rightarrow 10$
$Q_6 \rightarrow 110$
etc.

Quantization Mode Decision

For each LSF vector, all possible absolute and differential quantization modes as described in Table 2 are each tried and, for example, the quantization mode which requires the minimum number of bits is selected. The encoded quantization mode and the corresponding set of quantization indices are transmitted to the decoder.

As mentioned in the foregoing description, the actual number of quantized LPC filters transmitted from the coder to the decoder is not fixed but rather depends on the ACELP/TCX decision taken at the coder. For example, long TCX (TCX1024) requires only the transmission of quantized filter LPC4 while any combination involving ACELP or short TCX (TCX256) requires the transmission of all four (4) quantized LPC filters LPC1 to LPC4. Only the quantized LPC filters that are required by the ACELP/TCX mode configuration are actually transmitted.

Decoding Process of Algebraic Vector Quantizer

As mentioned herein above, the actual number of quantized LPC filters coded within the bitstream depends on the ACELP/TCX mode combination of the super-frame. The ACELP/TCX mode combination is extracted from the bitstream and determines the coding modes, mod [k] for k=0 to 3, of each of the four (4) frames composing the super-frame. The mode value is 0 for ACELP, 1 for TCX256, 2 for TCX512, 3 for TCX1024.

In addition to the one (1) to four (4) quantized LPC filters of the super-frame, the above described, optional quantized filter LPC0 is transmitted for the first super-frame of each segment coded using the linear-prediction based codec.

The order in which the quantized LPC filters are normally found in the bitstream is: LPC4, the optional LPC0, LPC2, LPC1, and LPC3.

The condition for the presence of a given LPC filter within the bitstream is summarized in Table 4.

TABLE 4

Condition for the presence of a given LPC filter in the bitstream

| LPC filter | Present if |
|---|---|
| LPC0 | 1st super-frame encoded using LP |
| LPC1 | mod[0]<2 |
| LPC2 | mod[2]<3 |
| LPC3 | mod[2]<2 |
| LPC4 | Always |

Figure 9:
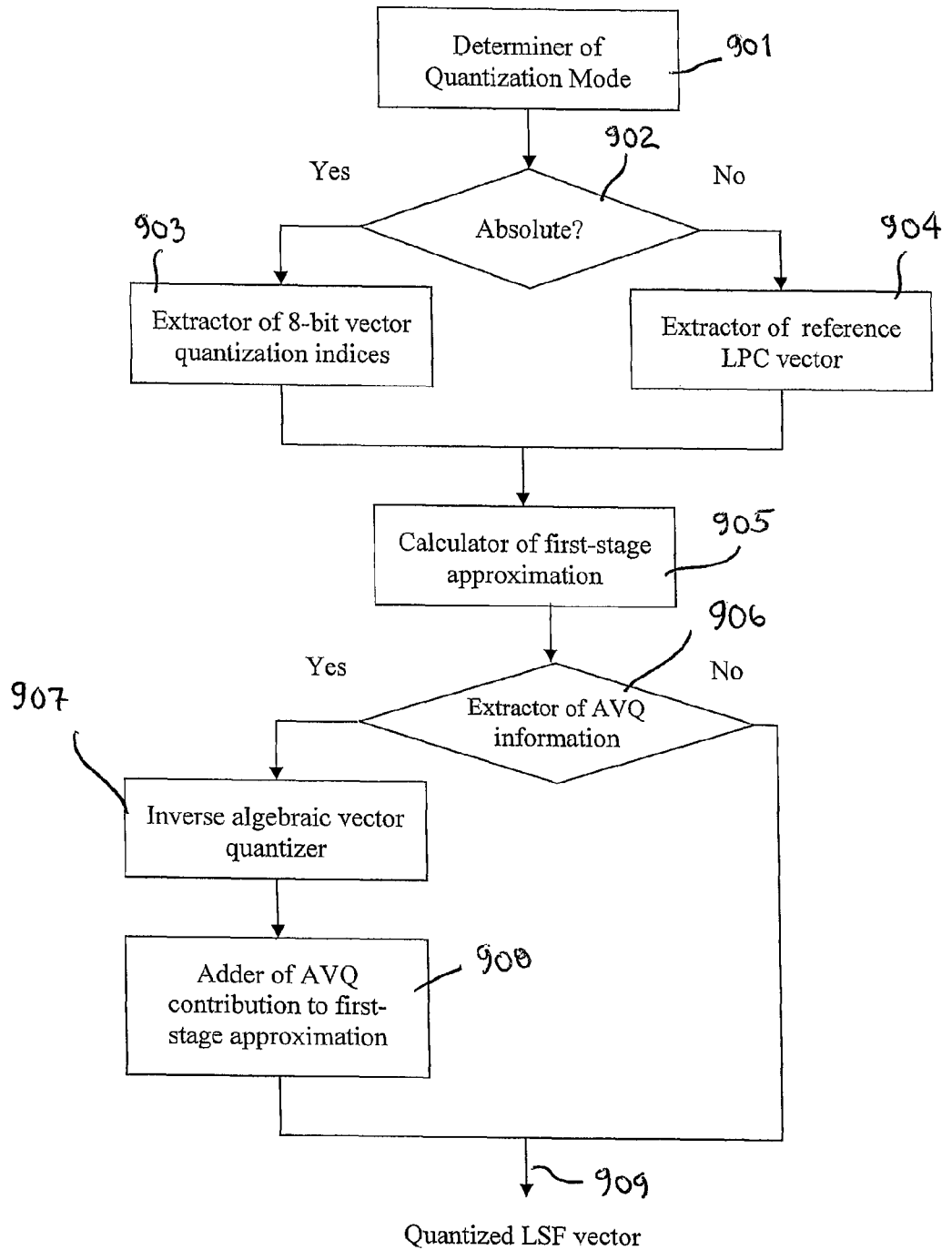
FIG. 9 is a schematic block diagram of a decoder and decoding method.

FIG. 9 is a schematic block diagram summarizing the decoding process.

Operations 901 and 902: The decoder comprises means for receiving and extracting, for example a demultiplexer, from the received bit stream the quantization indices corresponding to each of the quantized LPC filters required by the ACELP/TCX mode combination. For a given quantized LPC filter, a determiner of quantization mode extracts from the bit stream received from the coder the index or information related to the quantization mode, and determines whether the quantization mode is the absolute or differential quantization mode as indicated in Table 2.

Operations 903 and 905: When Operations 901 and 902 determine that the quantization mode is the absolute quantization mode, an extractor extracts from the bit stream the index or indices corresponding to the stochastic VQ-quantized first-stage approximation (Operation 903). A calculator then computes the first-stage approximation through inverse-quantization (Operation 905).

Operations 904 and 905: When Operations 901 and 902 determine that the quantization mode is the differential quantization mode (not the absolute quantization mode), an extractor extracts from the bit stream the indices or information representative of the reference amongst the plurality of possible references, for example the reference LPC vector (Operation 904). The calculator then computes from this information the first-stage approximation as described with reference to Table 2 (Operation 905).

In Operation 906, an extractor of VQ information extracts from the bit stream received from the coder variable bit rate VQ information, for example AVQ information. More specifically, as a non-limitative example, the AVQ information for the two residual LSF sub-vectors $\hat{B}_k$ are extracted from the bit stream. The AVQ information normally comprises two encoded codebook numbers and the corresponding AVQ indices. The only exception is when filter LPC 1 is differentially quantized relative to (quantized filter LPC0+quantized filter LPC2)/2, since in this case there is no AVQ information present in the bit stream. In the case of the latter exception, the quantized LSF vector 909 is outputted as the first-stage approximation from Operation 905.

Operation 907: An inverse algebraic vector quantizer receives the extracted AVQ information from Operation 906 to inverse quantize, or inverse weight and recover the AVQ contribution.

Decoding of AVQ Indices

Decoding the LPC filters involves decoding the extracted AVQ information, for example the AVQ parameters describing each quantized sub-vector $\hat{B}_k$ of the weighted residual LSF vector. In the foregoing example, each sub-vector $B_k$ has a dimension 8. The AVQ parameters for each sub-vector $B_k$ are described in the second operation of the above described algebraic vector quantization. For each quantized sub-vector $\hat{B}_k$, three sets of binary indices are sent by the coder to the decoder:
  a) the codebook number $n_k$, transmitted using an entropy code as described in the third operation of the above described algebraic vector quantization;

b) the rank $I_k$ of a selected lattice point z in a base codebook, which indicates what permutation has to be applied to a specific leader (see second operation of the above described algebraic vector quantization) to obtain a lattice point z; and c) if the quantized sub-vector $\hat{B}_k$ (a lattice point in lattice $RE_8$) was not in the base codebook, the 8 indices of the Voronoi extension index vector k calculated in sub-operation V1 of the second operation of the above described algebraic vector quantization; from the Voronoi extension indices, an extension vector v can be computed as taught by Reference [8]. The number of bits in each component of index vector k is given by the extension order r, which can be obtained from the code value of index $n_k$. The scaling factor M of the Voronoi extension is given by $M=2^r$.

Then, from the scaling factor M, the Voronoi extension vector v (a lattice point in lattice $RE_8$) and the lattice point z in the base codebook (also a lattice point in lattice $RE_8$), each quantized scaled sub-vector $\hat{B}_k$ can be computed using the following relation:

$$\hat{B}_k = Mz + v.$$

When there is no Voronoi extension (i.e. $n_k < 5$, $M=1$ and $z=0$), the base codebook is either codebook $Q_0$, $Q_2$, $Q_3$ or $Q_4$ from Reference [6]. No bits are then required to transmit vector k. Otherwise, when Voronoi extension is used because $\hat{B}_k$ is large enough, then only $Q_3$ or $Q_4$ from Reference [6] is used as a base codebook. The selection of $Q_3$ or $Q_4$ is implicit in the codebook number value $n_k$, as described in the second operation of the above described algebraic vector quantization.

Operation 908: An adder sums the first-stage approximation from Operation 905 to the inverse-weighed AVQ contribution from Operation 907 to reconstruct and recover the quantized LSF vector 909.

Although the present invention has been defined in the foregoing description by means of illustrative embodiments thereof, these embodiments can be modified at will, within the scope of the appended claims, without departing from the spirit and nature of the present invention.

References

[1] 3GPP Technical Specification TS 26.290, "Audio Codec Processing Functions; Extended Adaptive Multi-Rate—Wideband (AMR-WB+) Codec; Transcoding Functions," June 2005.

[2] J. Skoglund, J. Linden, "Predictive VQ for Noisy Channel Spectrum Coding: AR Or MA?," IEEE 1997 International Conference on Acoustics, Speech, and Signal Processing (ICASSP '97), pp. 1351-1354, Munich, Germany, Apr. 21-24, 1997.

[3] H. Zarrinkoub, P. Mermelstein, "Switched Prediction and Quantization of LSP Frequencies," IEEE 1996 International Conference on Acoustics, Speech, and Signal Processing (ICASSP '96), Vol. 2, pp. 757-760, 7-10 May 1996.

[4] A. V. McCree, "Method for Switched-Predictive Quantization," U.S. Pat. No. 6,122,608.

[5] R. Laroia, N. Phamdo, and N. Farvardin, "Robust and Efficient Quantization of Speech LSP Parameters Using Structured Vector Quantizers," IEEE Int. Conf. on Acoustics, Speech and Signal Processing (ICASSP '1991), pp. 641-644, Washington, D.C., Apr. 14-17, 1991.

[6] M. Xie and J.-P. Adoul, "Embedded Algebraic Vector Quantization (EAVQ) with Application to Wideband Audio Coding," IEEE International Conference on Acoustics, Speech, and Signal Processing (ICASSP), Atlanta, Ga., U.S.A, Vol. 1, pp. 240-243, 1996.

[7] P. Rault, C. Guillemot, "Indexing Algorithm for Zn, An, Dn and Dn++ Lattice Vector Quantizers," IEEE Transactions on Multimedia, Vol. 3, No. 4, December 2001.

[8] J. H. Conway and N. J. A. Sloane, "A Fast Encoding Method for Lattice Codes and Quantizers," IEEE Trans. Inform. Theory, Vol. IT-29, No. 6, pp. 820-824, November 1983.

What is claimed is:

1. A multi-reference quantization device for quantizing an input LPC filter, comprising:
   a plurality of differential quantizers using respective, different references; and
   means for selecting a reference amongst the different references of the differential quanitizers using a reference selection criterion;
   wherein the input LPC filter is differentially quantized by the differential quantizer using the selected reference.

2. A multi-reference quantization device for quantizing an input LPC filter, comprising:
   a plurality of differential quantizers using respective, different references; and
   a selector of a reference amongst the different references of the differential quantizers using a reference selection criterion;
   wherein the input LPC filter is differentially quantized by the differential quantizer using the selected reference.

3. A multi-reference LPC filter quantization device as defined in claim 2, comprising a transmitter of the differentially quantized LPC filter produced by the differential quantizer using the selected reference to a decoder.

4. A multi-reference LPC filter quantization device as defined in claim 2, wherein the reference selector comprises a closed-loop selector in which all the different references are tried in the respective differential quantizers and the reference that optimizes the reference selection criterion is chosen.

5. A multi-reference LPC filter quantization device as defined in claim 2, wherein the reference selector comprises an open-loop selector which performs a predetermination of the reference based on values of coefficients of the input LPC filter to be quantized and on values of coefficients of filters forming the different references.

6. A multi-reference LPC filter quantization device as defined in claim 5, comprising a transmitter of indices representative of the selected reference and the differential quantizer using the selected reference to a decoder.

7. A multi-reference quantization device for quantizing an input LPC filter, comprising:
   a plurality of differential quantizers using respective, different references; and
   a selector of a reference amongst the different references of the differential quantizers using a reference selection criterion;
   wherein the input LPC filter is differentially quantized by the differential quantizer using the selected reference; and
   wherein at least one of the references is selected from the group consisting of:
   a previously quantized LPC filter;
   a future quantized LPC filter;
   a mean value of the previously quantized and future quantized LPC filters;
   a LPC filter quantized using an absolute quantizer;
   a result of an extrapolation operation applied to a past quantized LPC filter;
   a result of an extrapolation operation applied to a future quantized LPC filter;

a result of an interpolation operation applied to a past quantized LPC filter;

a result of an interpolation operation applied to a future quantized LPC filter;

a result of an auto-regressive prediction applied to a quantized LPC filter;

a result of a moving average prediction applied to a quantized LPC filter; and a quantized filter value known to both an encoder and a decoder.

8. A multi-reference quantization device for quantizing an input LPC filter, comprising:

a plurality of differential quantizers using respective, different references; and a selector of a reference amongst the different references of the differential quantizers using a reference selection criterion;

wherein the input LPC filter is differentially quantized by the differential quantizer using the selected reference; and wherein the reference selection criterion is selected from the group consisting of:

a first criterion that minimizes a bit rate to achieve a target level of distortion; and a second criterion that minimizes the level of distortion produced at a given bit rate.

9. A quantization device for quantizing an input LPC filter, comprising:

a plurality of differential quantizers using respective, different references;

at least one absolute quantizer; and a selector of one of absolute quantization mode and differential quantization modes for quantizing the input LPC filter using a quantization mode selection criterion, and of a reference amongst the different references of the differential quantizers using a reference selection criterion.

10. A LPC filter quantization device as defined in claim 9, comprising a transmitter of an index representative of the selected absolute or differential quantization mode to a decoder.

11. A quantization device for quantizing an input LPC filter, comprising:

a plurality of differential quantizers using respective, different references;

at least one absolute quantizer; and a selector of one of absolute quantization mode and differential quantization modes for quantizing the input LPC filter using a quantization mode selection criterion, and of a reference amongst the different references of the differential quantizers using a reference selection criterion;

wherein the quantization mode selection criterion is selected from the group consisting of:

a first criterion that minimizes a bit rate to achieve a target level of distortion; and a second criterion that minimizes the level of distortion produced at a given bit rate.

12. A multi-reference quantization method for quantizing an input LPC filter, comprising:

providing a plurality of differential quantizers using respective, different references;

selecting a reference amongst the different references using a reference selection criterion; and quantizing the input LPC filter with the differential quantizer using the selected reference.

13. A multi-reference LPC filter quantization method as defined in claim 12, comprising transmitting to a decoder the differentially quantized LPC filter produced by the differential quantizer using the selected reference.

14. A multi-reference LPC filter quantization method as defined in claim 12, wherein selecting the reference comprises a closed-loop selection including trying all the different references in the respective differential quantizers and choosing the reference that optimizes the reference selection criterion.

15. A multi-reference LPC filter quantization method as defined in claim 12, wherein selecting the reference comprises an open-loop selection including performing a predetermination of the reference based on values of coefficients of the input LPC filter to be quantized and on values of coefficients of filters forming the different references.

16. A multi-reference LPC filter quantization method as defined in claim 12, comprising transmitting to a decoder indices representative of the selected reference and the differential quantizer using the selected reference.

17. A multi-reference quantization method for quantizing an input LPC filter, comprising:

providing a plurality of differential quantizers using respective, different references;

selecting a reference amongst the different references using a reference selection criterion; and quantizing the input LPC filter with the differential quantizer using the selected reference;

wherein at least one of the references is selected from the group consisting of:

a previously quantized LPC filter;

a future quantized LPC filter;

a mean value of the previously quantized and future quantized LPC filters;

a LPC filter quantized using an absolute quantizer;

a result of an extrapolation operation applied to a past quantized LPC filter;

a result of an extrapolation operation applied to a future quantized LPC filter;

a result of an interpolation operation applied to a past quantized LPC filter;

a result of an interpolation operation applied to a future quantized LPC filter;

a result of an auto-regressive prediction applied to a quantized LPC filter;

a result of a moving average prediction applied to a quantized LPC filter; and a quantized filter value known to both an encoder and a decoder.

18. A multi-reference quantization method for quantizing an input LPC filter, comprising:

providing a plurality of differential quantizers using respective, different references;

selecting a reference amongst the different references using a reference selection criterion; and quantizing the input LPC filter with the differential quantizer using the selected reference;

wherein the reference selection criterion is selected from the group consisting of:

a first criterion that minimizes a bit rate to achieve a target level of distortion; and a second criterion that minimizes the level of distortion produced at a given bit rate.

19. A quantization method for quantizing an input LPC filter, comprising:

providing a plurality of differential quantizers using respective, different references;

providing at least one absolute quantizer; and selecting at least one of (a) a quantization mode amongst absolute quantization mode and differential quantization modes for quantizing the input LPC filter using a quantization mode selection criterion, and (b) a reference amongst the different references using a reference selection criterion.

20. A LPC filter quantization method as defined in claim 19, comprising transmitting to a decoder an index representative of the selected absolute or differential quantization mode.

21. A quantization method for quantizing an input LPC filter, comprising:

providing a plurality of differential quantizers using respective, different references;

providing at least one absolute quantizer; and selecting at least one of (a) a quantization mode amongst absolute quantization mode and differential quantization modes for quantizing the input LPC filter using a quantization mode selection criterion, and (b) a reference amongst the different references using a reference selection criterion;

wherein the quantization mode selection criterion is selected from the group consisting of:

a first criterion that minimizes a bit rate to achieve a target level of distortion; and a second criterion that minimizes the level of distortion produced at a given bit rate.

22. A device for inverse quantizing a multi-reference differentially quantized LPC filter extracted from a bitstream, comprising:

means for extracting from the bitstream information about a reference amongst a plurality of possible references used for quantizing the multi-reference differentially quantized LPC filter; and means for inverse quantizing the multi-reference differentially quantized LPC filter using the reference corresponding to the extracted reference information.

23. A device for inverse quantizing a multi-reference differentially quantized LPC filter as defined in claim 22, further comprising:

means for extracting from the bitstream information about a quantization mode to determine if the LPC filter has been quantized using absolute quantization or multi-reference differential quantization.

24. A device for inverse quantizing a multi-reference differentially quantized LPC filter as defined in claim 23, wherein the information about the quantization mode comprises an index representative of absolute quantization or multi-reference differential quantization.

25. A device for inverse quantizing a multi-reference differentially quantized LPC filter as defined in claim 23, wherein, if the information about the quantization mode indicates that the LPC filter has been quantized using absolute quantization, the means for inverse quantizing uses inverse absolute quantization.

26. A device for inverse quantizing a multi-reference differentially quantized LPC filter extracted from a bitstream, comprising:

an extractor from the bitstream of information about a reference amongst a plurality of possible references used for quantizing the multi-reference differentially quantized LPC filter; and a differential inverse quantizer using the reference corresponding to the extracted reference information to inverse quantize the multi-reference differentially quantized LPC filter.

27. A device for inverse quantizing a multi-reference differentially quantized LPC filter as defined in claim 26, wherein the information about the reference comprises indices representative of the reference.

28. A device for inverse quantizing a multi-reference differentially quantized LPC filter extracted from a bitstream, comprising:

an extractor from the bitstream of information about a reference amongst a plurality of possible references used for quantizing the multi-reference differentially quantized LPC filter; and a differential inverse quantizer using the reference corresponding to the extracted reference information to inverse quantize the multi-reference differentially quantized LPC filter;

wherein the reference is selected from the group consisting of:

a previously quantized LPC filter;

a future quantized LPC filter;

a mean value of the previously quantized and future quantized LPC filters;

a LPC filter quantized using an absolute quantizer;

a result of an extrapolation operation applied to a past quantized LPC filter;

a result of an extrapolation operation applied to a future quantized LPC filter;

a result of an interpolation operation applied to a past quantized LPC filter;

a result of an interpolation operation applied to a future quantized LPC filter;

a result of an auto-regressive prediction applied to a quantized LPC filter;

a result of a moving average prediction applied to a quantized LPC filter; and a quantized filter value known to both an encoder and a decoder.

29. A device for inverse quantizing a quantized LPC filter extracted from a bitstream, comprising:

an extractor from the bitstream of information about a quantization mode amongst absolute quantization mode and differential quantization mode, and of information about a reference amongst a plurality of possible references used in the differential quantization mode; and an absolute inverse quantizer for inverse quantizing the quantized LPC filter when the information about the quantization mode indicates that the LPC filter has been quantized using the absolute quantization mode; and a differential inverse quantizer for inverse quantizing the quantized LPC filter using the reference corresponding to the extracted reference information when the information about the quantization mode indicates that the LPC filter has been quantized using the differential quantization mode.

30. A method for inverse quantizing a multi-reference differentially quantized LPC filter extracted from a bitstream, comprising:

extracting from the bitstream information about a reference amongst a plurality of possible references used for quantizing the multi-reference differentially quantized LPC filter; and inverse quantizing the multi-reference differentially quantized LPC filter using the reference corresponding to the extracted reference information.

31. A method for inverse quantizing a multi-reference differentially quantized LPC filter as defined in claim 30, wherein the information about the reference comprises indices representative of the reference.

32. A method for inverse quantizing a multi-reference differentially quantized LPC filter as defined in claim 30, further comprising:
extracting from the bitstream information about a quantization mode to determine if the LPC filter has been quantized using absolute quantization or multi-reference differential quantization.

33. A method for inverse quantizing a multi-reference differentially quantized LPC filter as defined in claim 32, wherein the information about the quantization mode comprises an index representative of absolute quantization or multi-reference differential quantization.

34. A method for inverse quantizing a multi-reference differentially quantized LPC filter as defined in claim 32, wherein, if the information about the quantization mode indicates that the LPC filter has been quantized using absolute quantization, the LPC filter is inverse quantized using inverse absolute quantization.

35. A method for inverse quantizing a multi-reference differentially quantized LPC filter extracted from a bitstream, comprising:
extracting from the bitstream information about a reference amongst a plurality of possible references used for quantizing the multi-reference differentially quantized LPC filter; and
inverse quantizing the multi-reference differentially quantized LPC filter using the reference corresponding to the extracted reference information;
wherein the reference is selected from the group consisting of:
a previously quantized LPC filter;
a future quantized LPC filter;
a mean value of the previously quantized and future quantized LPC filters;
a LPC filter quantized using an absolute quantizer;
a result of an extrapolation operation applied to a past quantized LPC filter;
a result of an extrapolation operation applied to a future quantized LPC filter;
a result of an interpolation operation applied to a past quantized LPC filter;
a result of an interpolation operation applied to a future quantized LPC filter;
a result of an auto-regressive prediction applied to a quantized LPC filter;
a result of a moving average prediction applied to a quantized LPC filter; and
a quantized filter value known to both an encoder and a decoder.

36. A method for inverse quantizing a quantized LPC filter extracted from a bitstream, comprising:
extracting from the bitstream at least one of (a) information about a quantization mode amongst absolute quantization mode and differential quantization mode, and (b) information about a reference amongst a plurality of possible references used in the differential quantization mode; and
absolute inverse quantizing the quantized LPC filter when the information about the quantization mode indicates that the LPC filter has been quantized using the absolute quantization mode; and
differential inverse quantizing the quantized LPC filter using the reference corresponding to the extracted reference information when the information about the quantization mode indicates that the LPC filter has been quantized using the differential quantization mode.

* * * * *

UNITED STATES PATENT AND TRADEMARK OFFICE
CERTIFICATE OF CORRECTION

PATENT NO. : 8,332,213 B2
APPLICATION NO. : 12/501188
DATED : December 11, 2012
INVENTOR(S) : Philippe Gournay et al.

It is certified that error appears in the above-identified patent and that said Letters Patent is hereby corrected as shown below:

In the Specification

Col. 1, line 10, replace "61/202,705" with --61/202,075--.

Signed and Sealed this
Twelfth Day of November, 2013

Teresa Stanek Rea
*Deputy Director of the United States Patent and Trademark Office*